US012696468B2

(12) United States Patent
Tu et al.

(10) Patent No.:    US 12,696,468 B2
(45) Date of Patent:         Jul. 28, 2026

(54) SEMICONDUCTOR DEVICE WITH REVERSE-TAPERED STRUCTURE AND MANUFACTURING METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Chien-Te Tu, Hsinchu (TW); Chee-Wee Liu, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 1093 days.

(21) Appl. No.: 17/830,266

(22) Filed: Jun. 1, 2022

(65) Prior Publication Data

US 2023/0395693 A1     Dec. 7, 2023

(51) Int. Cl.
| | |
|---|---|
| *H10D 30/01* | (2025.01) |
| *H10D 30/43* | (2025.01) |
| *H10D 30/67* | (2025.01) |
| *H10D 62/10* | (2025.01) |
| *H10P 14/20* | (2026.01) |
| *H10P 50/24* | (2026.01) |

(52) U.S. Cl.
CPC ......... *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01); *H10P 14/3411* (2026.01); *H10P 14/3462* (2026.01); *H10P 50/242* (2026.01)

(58) Field of Classification Search
CPC .... H10D 30/014; H10D 30/031; H10D 30/43; H10D 30/6735; H10D 30/6757; H10D 62/121; H10D 30/797; H10D 64/017; H10D 62/822; H01L 21/02532; H01L 21/02603; H01L 21/3065; B82Y 10/00
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |

(Continued)

FOREIGN PATENT DOCUMENTS

| | | |
|---|---|---|
| TW | I574414 B | 3/2017 |

OTHER PUBLICATIONS

Witek Maszara, "MOSFET Scaling Knobs and Future Alternatives", IEEE International Electron Devices Meeting (IEDM) 2018 Short Course, 2018.

(Continued)

*Primary Examiner* — Ratisha Mehta
*Assistant Examiner* — Sophia W Kao
(74) *Attorney, Agent, or Firm* — Maschoff Brennan

(57) ABSTRACT

A method includes forming a semiconductor structure on a substrate; performing a first etching process on the semiconductor structure to form a fin structure upwardly extending above the substrate; performing a second etching process to trim the fin structure to have a reverse-trapezoidal cross-sectional profile; forming source/drain regions on opposite regions of the fin structure; forming a gate structure between the source/drain regions.

20 Claims, 26 Drawing Sheets

(56)                References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2019/0165135 | A1* | 5/2019 | Cheng ................ H10D 30/6735 |
| 2020/0168470 | A1* | 5/2020 | Han .................. H01L 21/31056 |
| 2020/0176584 | A1* | 6/2020 | Wu .................... H10D 30/6213 |
| 2021/0098634 | A1* | 4/2021 | Chung ................ H10D 64/017 |
| 2023/0178632 | A1* | 6/2023 | Yu ........................ H10D 62/121 |
| | | | 257/213 |

OTHER PUBLICATIONS

C. Auth et al., "A 10nm High Performance and Low-Power CMOS Technology Featuring 3rd Generation FinFET Transistors, Self-Aligned Quad Patterning, Contact over Active Gate and Cobalt Local Interconnects", 2017 IEEE International Electron Devices Meeting (IEDM), 2017, pp. 29.1.1-29.1.4.

V. Destefanis et al., "HCI Selective Etching of Si1-xGex versus Si for Silicon on Nothing and Multi Gate Devices", ECS Transactions, vol. 16, No. 10, 2008, pp. 427-438.
N. Loubet et al., "A Novel Dry Selective Etch of SiGe for the Enablement of High Performance Logic Stacked Gate-All-Around NanoSheet Devices", 2019 IEEE International Electron Devices Meeting (IEDM), 2019, pp. 11.4.1-11.4.4.
C. -Y. Huang et al., "3-D Self-aligned Stacked NMOS-on-PMOS Nanoribbon Transistors for Continued Moore's Law Scaling", 2020 IEEE International Electron Devices Meeting (IEDM), 2020, p. 20.6.1-20.6.4.
Yi-Chun Liu et al., "First Highly Stacked Ge0.95Si0.05 nGAAFETs with Record ION = 110 μA (4100 μA/μm) at VOV=VDS=0.5V and High Gm, max = 340 μS (13000 μS/μm) at VDS=0.5V by Wet Etching", 2021 Symposium on VLSI Technology, 2021, pp. 1-2.
Yi-Chun Liu et al., "Novel vertically stacked Ge0.85Si0.15 nGAAFETs above a Si channel with low SS of 76 mV/dec by underneath Si channel and enhanced Ion (1.7X at VOV = VDS = 0.5 V) by Ge0.85Si0.15 channels", Semiconductor Science and Technology, vol. 35, 2020, 055010, pp. 1-8.
S. Borel et al., "Isotropic etching of SiGe alloys with high selectivity to similar materials", Microelectronic Engineering, vol. 73-74, 2004, pp. 301-305.
L. Milord et al., "Inductively Coupled Plasma etching of Germanium Tin for the fabrication of photonic components", Proc. of SPIE vol. 10108, 2017, pp. 101080C-1-101080C-7.

* cited by examiner

C-C'

100

B-B'

100

C-C'

B-B'

C-C'

B-B'

C-C'

B-B'

C-C'

B-B'

SEMICONDUCTOR DEVICE WITH REVERSE-TAPERED STRUCTURE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
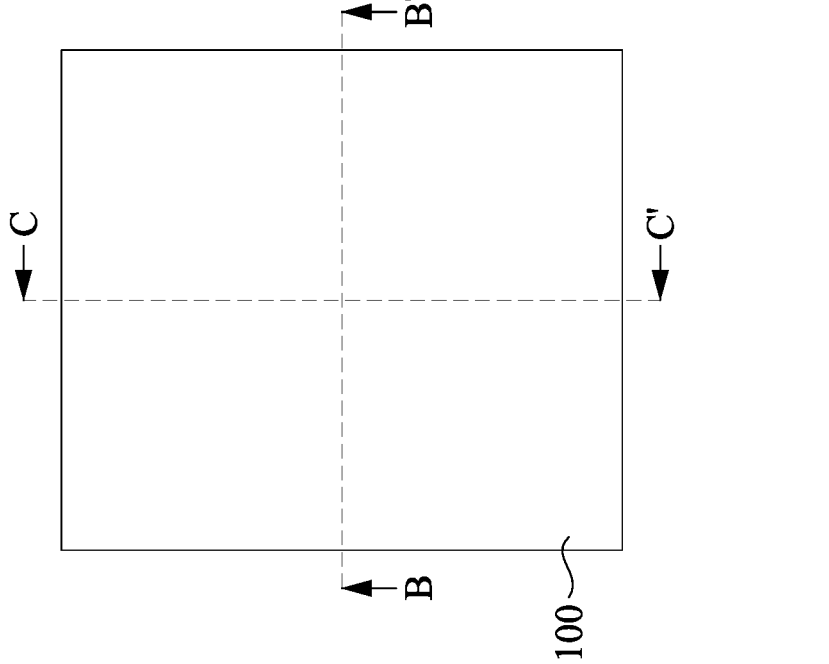
FIGS. 1A to 12D illustrate schematic views of intermediate stages in the formation of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

In the course of IC evolution, a GAA device is provided to reduce current leakage from channels to the substrate. Forming the GAA device includes forming a fin structure including altering channel layers and sacrificial layers, then removing the sacrificial layers to release the channel layers, and then forming a gate structure wrapping around the released channel layers. However, during an etching process for removing the sacrificial layers, the etching process may unintentionally trim the channel layers. The higher channel layer is positioned, the faster the channel layer is etched in the etching process, and thus the channel layers may have different dimensions (i.e., non-uniform channel size on width/thickness), which in turn produces a $V_t$ variation in the nano-FET and causes issues for the CMOS circuit design.

Therefore, the present disclosure in various embodiments provides an additional etching process on the fin structure prior to removing the sacrificial layers. The additional etching process trims the fin structure to have a reverse-tapered profile. As discussed previously, a subsequent etching process for removing the sacrificial layers may unintentionally trim the channel layers, and an etching rate of unintentionally trimming the channel layers will decrease from fin top to fin bottom, which means the higher the channel layer is positioned, the more the dimension reduction takes place on the channel layer in the unintentionally trimming. However, because of the reverse-tapered profile, the higher the channel layer is positioned, the wider the channel layer is. Therefore, the channel layer width difference resulting from the reverse-tapered profile can serve as a balance that aids in counteracting the dimension reduction difference (i.e., etch rate difference) caused by the channel releasing etching process. Therefore, after performing the channel releasing etching process, dimension differences (e.g., width/thickness difference) among channel layers can be reduced, thereby improving the dimension uniformity among the channel layers, such that a Vt difference in the nano-FET can be reduced, and IO N per footprint in the nano-FET can be improved.

FIGS. 1A, 2A, 3A, 4A, 5A, 6A, 7A, 8A, 9A, 10A, 11A, and 12A illustrate plane views (top views) of intermediate stages in the formation of a semiconductor device in accordance with some embodiments of the present disclosure. FIGS. 1B, 2B, 3B, 4B, 5B, 6B, 7B, 8B, 9B, 10B, 11B, and 12B illustrate cross-sectional views obtained from reference cross-section B-B' in FIGS. 1A, 2A, 3A, 4A, 5A, 6A, 7A, 8A, 9A, 10A, 11A, and 12A, respectively. FIGS. 1C, 2C, 3C, 4C, 5C, 6C, 7C, 8C, 9C, 10C, 11C, and 12C illustrate cross-sectional views obtained from reference cross-section B-B' in FIGS. 1A, 2A, 3A, 4A, 5A, 6A, 7A, 8A, 9A, 10A, 11A, and 12A, respectively.

Figure 1C:
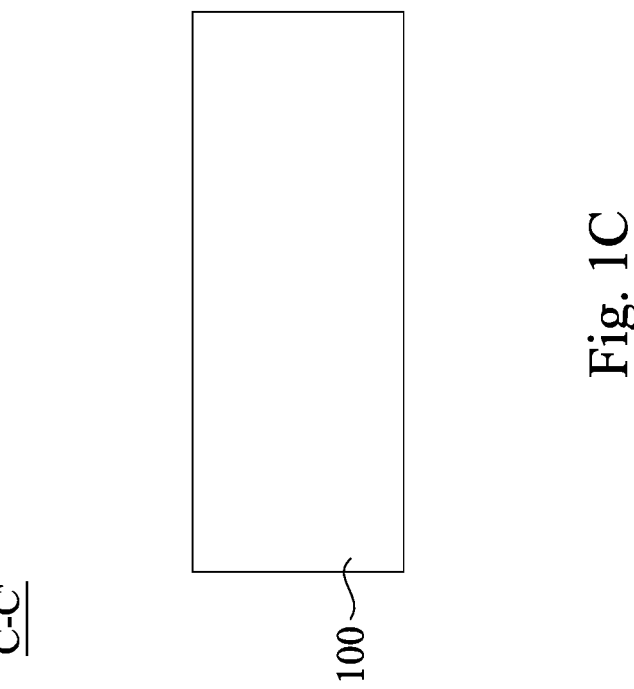
Figure 1B:
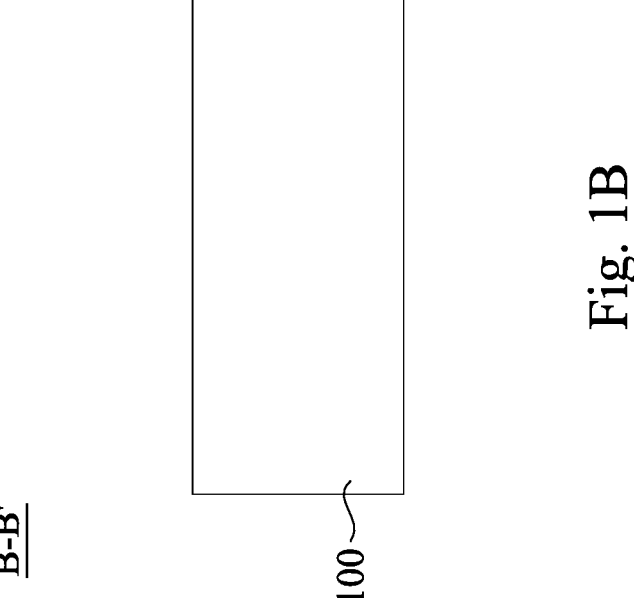

Reference is made to FIGS. 1A, 1B, and 1C. A substrate 100 is provided for forming nano-FETs. The substrate 100 may be a semiconductor substrate, such as a bulk semiconductor, a semiconductor-on-insulator (SOI) substrate, or the like, which may be doped (e.g., with a p-type or an n-type impurity) or undoped. The substrate 100 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the substrate 100 may be a material, such as a III-V compound semiconductor, a II-VI compound semiconductor, or the like. In some embodiments, the semiconductor material of the substrate 100 may include silicon; germanium; a compound semiconductor including silicon carbide, gallium arsenide, gallium stannum, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 100 has an n-type region and a p-type region. The n-type region can be for forming n-type devices, such as NMOS transistors, e.g., n-type nano-FETs, and the p-type region can be for forming p-type devices, such as PMOS transistors, e.g., p-type nano-FETs. The n-type region may be physically separated from the p-type region (not separately illustrated), and any number of device features (e.g., other active devices, doped regions, isolation structures, etc.) may be disposed between the n-type region and the p-type region.

The substrate 100 may be lightly doped with a p-type or an n-type impurity. An anti-punch-through (APT) implantation may be performed on an upper portion of the substrate 100 to form an APT region. During the APT implantation, impurities may be implanted in the substrate 100. The impurities may have a conductivity type opposite from a conductivity type of source/drain regions that will be subsequently formed in each of the n-type region and the p-type region. The APT region may extend under the source/drain regions in the nano-FETs. The APT region may be used to reduce the leakage from the source/drain regions to the substrate 100. In some embodiments, the doping concentration in the APT region may be in the range of about $10^{18}$ $cm^{-3}$ to about $10^{19}$ $cm^{-3}$.

Figure 2A:
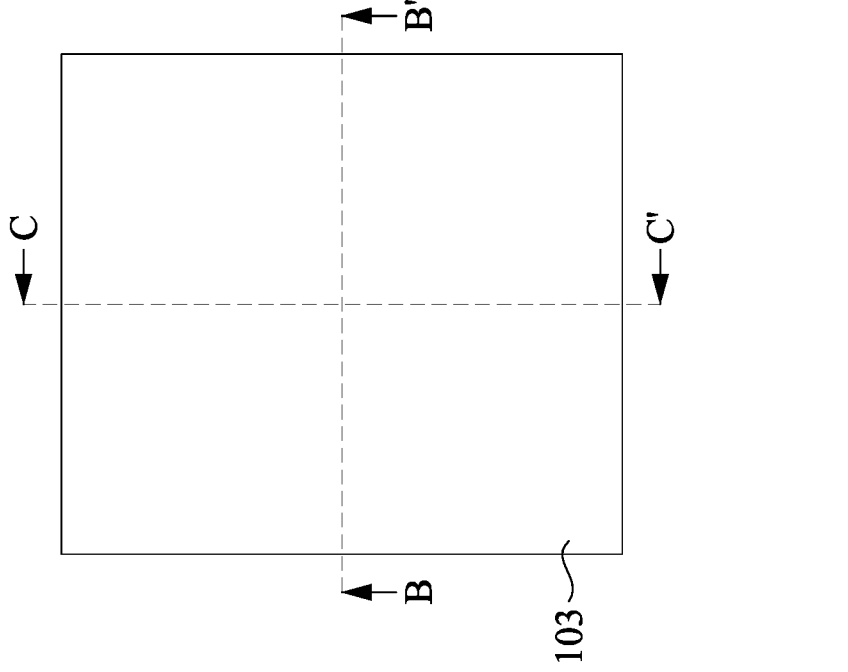
Figures 2B, 2C:
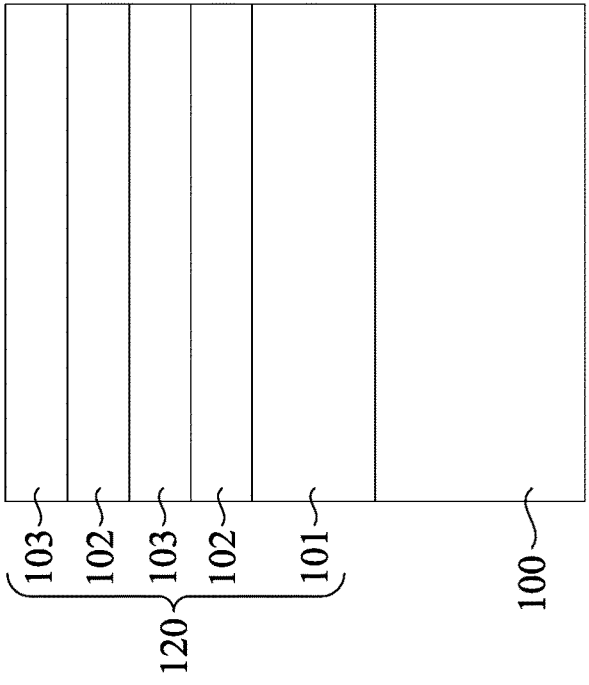

Reference is made to FIGS. 2A, 2B, and 2C. A multi-layer stack 120 (see FIGS. 2B and 2C) is formed over the substrate 100. The multi-layer stack 120 includes a first semiconductor layer 101 and alternating second semiconductor layers 120 and third semiconductor layers 103 above the first semiconductor layer 101. The first semiconductor layer 101 is formed of a first semiconductor material, the second semiconductor layers 102 are formed of a first semiconductor material, and the third semiconductor layers 103 are formed of a third semiconductor material. The first, second, and third semiconductor materials may each be selected from the candidate semiconductor materials of the substrate 100. In some embodiments, the multi-layer stack 120 includes two layers of each of the second semiconductor layers 102 and the third semiconductor layers 103. It should be appreciated that the multi-layer stack 120 may include any number of the second semiconductor layers 102 and the third semiconductor layers 103.

In some embodiments, the first semiconductor layer 101 may be different in composition from the substrate 100 and can be used to create lattice strain at an interface with the substrate 100. Therefore, the first semiconductor layer 101 can be interchangeably referred to as a strain relaxed buffer (SRB) layer. For example, the substrate 100 may include silicon and is substantially free of germanium while the first semiconductor layer 101 may include silicon germanium (SiGe). In some embodiments, the first semiconductor layer 101 may be made of silicon germanium (SiGe), and in particular, is of the composition $Si_{(1-x)}Ge_x$, where x is a number ranging from 0 to 1, indicating the atomic percentage of germanium. For example, $Si_{0.5}Ge_{0.5}$ corresponds to a silicon germanium compound with 50 percent germanium. In some embodiments, the SRB layer 101 has germanium atomic concentration gradient. For example, the SRB layer 101 may have a graded germanium atomic concentration decreasing as a distance from a top surface of the substrate 50 increases.

In some embodiments, and as will be subsequently described in greater detail, the first and third semiconductor layers 101 and 103 will be removed and the second semiconductor layers 102 will patterned to form channel regions for the nano-FETs over the substrate 50. In some embodiments, the second semiconductor layers 102 can be interchangeably referred to channel layers, and the first and third semiconductor layers 101 and 103 can be interchangeably referred to sacrificial layers (or dummy layers), which will be removed in subsequent processing to expose the top surfaces and the bottom surfaces of the second semiconductor layers 102. The first and third semiconductor materials of the first and third semiconductor layers 101 and 103 may be made of materials that have a high etching selectivity from the etching of the second semiconductor layers 102, so that the first and third semiconductor layers 101 and 103 may be removed without removing the second semiconductor layers 102. In some embodiments, the third semiconductor layers 103 may be made of a different material than the first semiconductor layer 101. In some embodiments, the third semiconductor layers 103 may be made of a same material as the first semiconductor layer 101. By way of example and not limitation, the second semiconductor material of the second semiconductor layers 102 may include a material suitable for both n-type and p-type devices, such as silicon, and the first and third semiconductor materials of the first and third semiconductor layers 101 and 103 may include silicon germanium. In some embodiments, the first semiconductor layer 101 may have a thicker thickness than the third semiconductor layers 103. In some embodiments, one of the third semiconductor layers 103 in a lower position may have a thicker thickness than another one of the third semiconductor layers 103 in a higher position.

Each of the layers of the multi-layer stack 120 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in a range of about 5 nm to about 30 nm. In some embodiments, some layers (e.g., the third semiconductor layers 103) are formed to be thinner than other layers (e.g., the second semiconductor layers 102). For example, in some embodiments in which the third semiconductor layers 103 are sacrificial layers (or dummy layers) and the second semiconductor layers 102 are patterned to form channel regions for the nano-FETs in both the n-type region and the p-type region, the first semiconductor layer 101 or the third semiconductor layer 103 can have a first thickness, and the second semiconductor layers 102 can have a second thickness, with the second thickness being from about 30% to about 60% less than the first thickness. Forming the second semiconductor layers 102 to a smaller thickness allows the channel regions to be formed at a greater density. In some embodiments, the first semiconductor layer 101 is formed to be thicker than other layers in the multi-layer stack 120 (e.g., the second and third semiconductor layers 102 and 103).

Figure 3A:
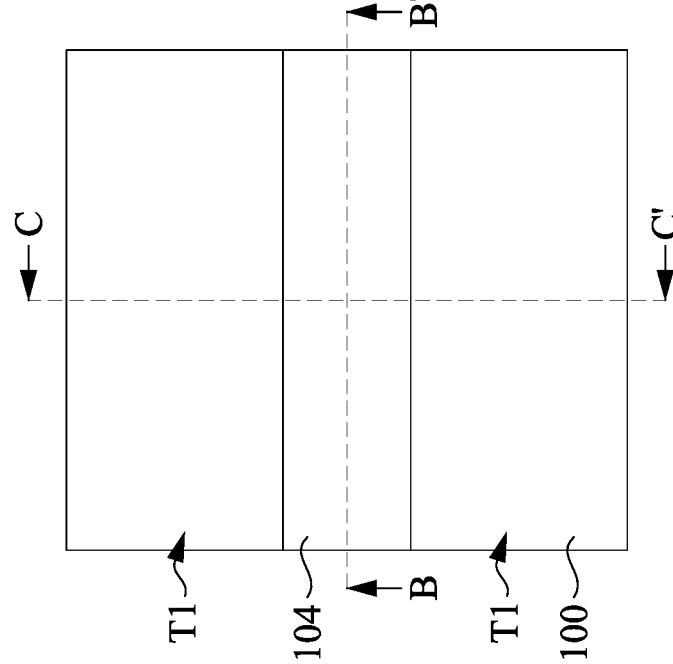
Figures 3B, 3C:
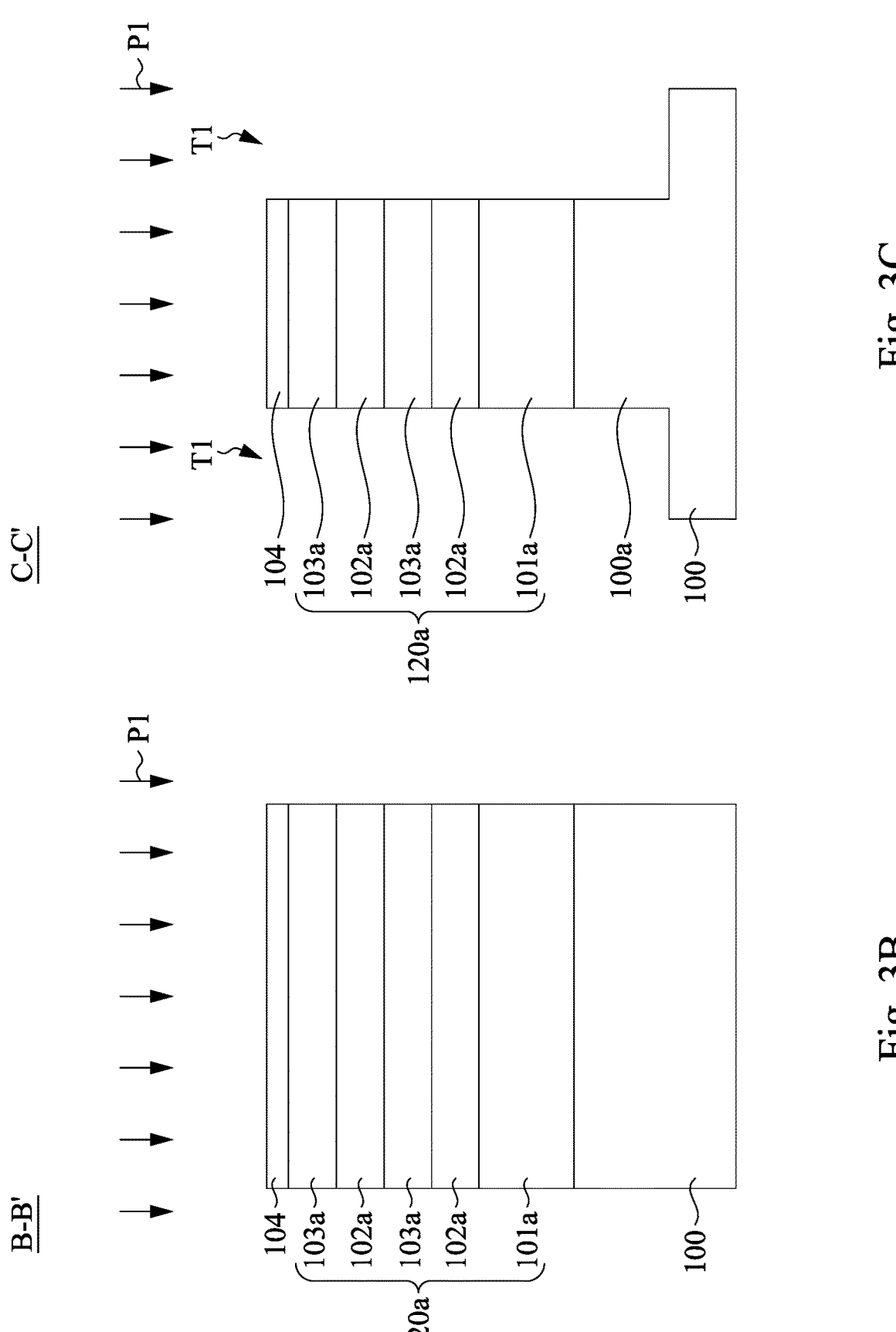

Reference is made to FIGS. 3A, 3B, and 3C. In some embodiments, a first etching process P1 is performed on the substrate 100 and the multi-layer stack 120 to formed trenches T1. The trenches T1 define a fin strip 100a and a fin structure 120a on the fin strip 100a. The fin strip 100a is semiconductor strip patterned in the substrate 100. The fin structure 120a includes a first nanostructure 101a, second nanostructures 102a, and third nanostructures 103a including the remaining portions of the first, second, and third semiconductor layers 101, 102, and 103, respectively. The trenches T1 may be patterned by any acceptable etch process, such as a reactive ion etch (RIE), neutral beam etch (NBE), the like, or a combination thereof. The etching may be anisotropic. In some embodiments, the first etching process P1 may be a dry etch, such as a reactive ion etch (RIE) process. In some embodiments, the first etching process P1 may be performed under a pressure in a range from about 3 to 8 Torr, such as about 3, 4, 6, 7, or 8 Torr. In some embodiments, the first etching process P1 may be performed by using a chlorine-containing gas as the etching gas. In some embodiments, the first etching process P1 may be performed by using an etching gas without a bromine-containing gas.

The fin strip 100a and the first, second, and third nanostructures 101a, 102a, and 103a may be patterned by any suitable method. For example, the fin strip 100a and the first, second, and third nanostructures 101a, 102a, and 103a may be patterned by using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacer may then be used as hard mask layer 104 to pattern the fin strip 100a and the first, second, and third nanostructures 101a, 102a, and 103a. In some embodiments, the hard mask layer 104 (or other layer) can remain on the first, second, and third nanostructures 101a, 102a, and 103a. In some embodiments, the hard mask layer 104 made be made of an oxide, such as silicon oxide, a nitride, such as silicon nitride, the like, or a combination thereof. In some embodiments, the fin strip 100a and the first, second, and third nanostructures 101a, 102a, and 103a may each have widths in a range of about 8 nm to about 40 nm in the cross section view as shown in FIG. 3C. In some embodiments, the fin strip 100a and the first, second, and third nanostructures 101a, 102a, and 103a have substantially equal widths.

Figure 4A:
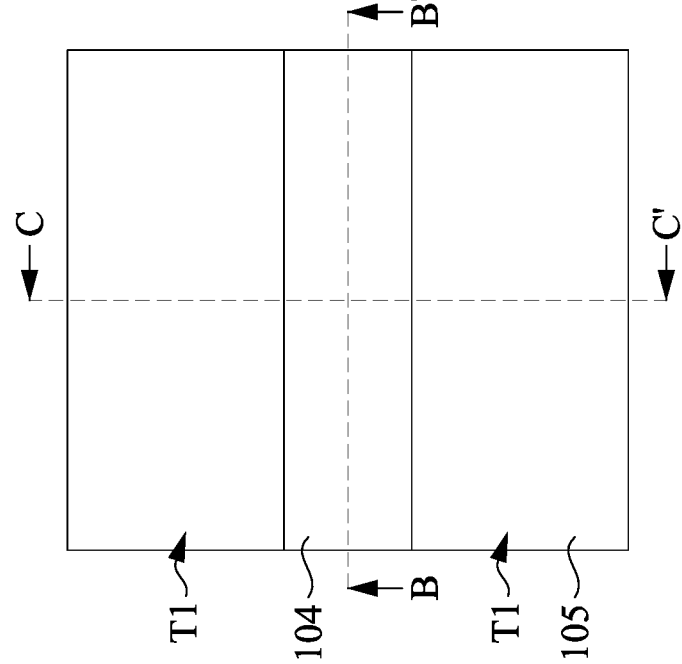
Figures 4B, 4C:
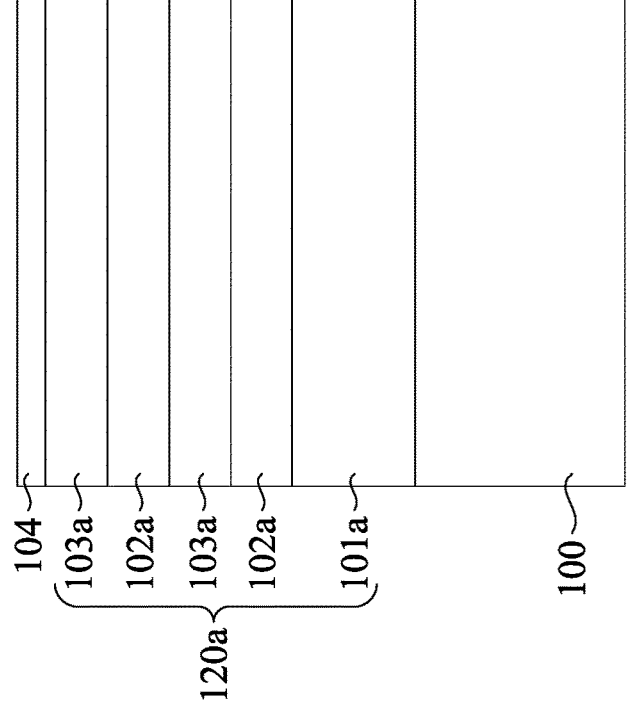

Reference is made to FIGS. 4A, 4B, and 4C. A shallow trench isolation (STI) region 105 is formed over the substrate 100 and laterally surrounds the fin strip 100a, such that the first, second, and third nanostructures 101a, 102a, and 103a may protrude from the STI region 105. In some embodiments, the top surface of the STI region 105 is coplanar (within process variations) with a top surface of the fin strip 100a. In some embodiments, the top surface of the STI region 105 is above or below the top surface of the fin strip 100a. In some embodiments, the STI region 105 may separate the features of adjacent devices.

The STI region 105 may be formed by any suitable method. For example, an insulation material can be formed over the substrate 100 and the first, second, and third nanostructures 101a, 102a, and 103a. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In some embodiments, the insulation material is formed such that excess insulation material covers the first, second, and third nanostructures 101a, 102a, and 103a. Although the STI region 105 is each illustrated as a single layer, some embodiments may utilize multiple layers. For example, in some embodiments a liner (not separately illustrated) may first be formed along surfaces of the substrate 100, the fin strip 100a, and the first, second, and third nanostructures 101a, 102a, and 103a. Thereafter, a fill material, such as those previously described may be formed over the liner.

A removal process is then applied to the insulation material to remove excess insulation material over the first, second, and third nanostructures 101a, 102a, and 103a. In some embodiments, a planarization process such as a chemical mechanical polish (CMP), an etch-back process, combinations thereof, or the like may be utilized. In embodiments in which the hard mask layer 104 remains on the first, second, and third nanostructures 101a, 102a, and 103a, the planarization process may expose the hard mask layer 104 or remove the hard mask layer 104. After the planarization process, the top surfaces of the insulation material and the hard mask layer 104 or the first, second, and third nanostructures 101a, 102a, and 103a are coplanar (within process variations). Accordingly, the top surfaces of the hard mask layer 104 or the first, second, and third nanostructures 101a, 102a, and 103a are exposed through the insulation material. In some embodiments, no mask remains on the first, second, and third nanostructures 101a, 102a, and 103a. The insulation material is then recessed to form the STI region 105. The insulation material is recessed such that at least a portion of the first, second, and third nanostructures 101a, 102a, and 103a protrude from the insulation material. Further, a top surface of the STI region 105 may have a flat surface as illustrated, a convex surface, a concave surface (such as dishing), or a combination thereof. The top surfaces of the STI region 105 may be formed flat, convex, and/or concave by an appropriate etch. The insulation material may be recessed using any acceptable etching process, such as one that is selective to the material of the insulation material (e.g., selectively etches the insulation material of the STI region 105 at a faster rate than the materials of the fin strip 100a and the first, second, and third nanostructures 101a, 102a, and 103a). For example, an oxide removal may be performed using dilute hydrofluoric (dHF) acid.

The process previously described is just one example of how the fin strip 100a and the first, second, and third nanostructures 101a, 102a, and 103a may be formed. In some embodiments, the fin strip 100a and/or the first, second, and third nanostructures 101a, 102a, and 103a may be formed using a mask and an epitaxial growth process. For example, a dielectric layer can be formed over a top surface of the substrate 100, and trenches can be etched through the dielectric layer to expose the underlying substrate 100.

Epitaxial structures can be epitaxially grown in the trenches, and the dielectric layer can be recessed such that the epitaxial structures protrude from the dielectric layer to form the fin strip 100a and/or top surface of the substrate 100. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together. Further, appropriate wells (not separately illustrated) may be formed in top surface of the substrate 100, the fin strip 100a, and/or the substrate 100. The wells may have a conductivity type opposite from a conductivity type of source/drain regions that will be subsequently formed in the fin strip 100a.

In the course of IC evolution, the nano-FET can be provided to reduce current leakage from channels to the substrate. Forming the nano-FETs may include forming the fin structure 120a (see FIGS. 3A-3C) that includes the first nanostructure 101a and altering second nanostructures 102a and third nanostructures 103a on the first nanostructure 101a, then removing the first and third nanostructures 101a and 103a (see FIGS. 11A-11C) to release the second nanostructures 102a, and then forming a gate structure (see FIGS. 12A-12C) wrapping around the released second nanostructures 102a. However, during a subsequent etching process for removing the first and third nanostructures 101a and 103a (also called channel releasing process), the etching process may unintentionally trim the second nanostructures 102a. In the channel releasing process, the higher the second nanostructure 102 is positioned, the faster the second nanostructure 102 is etched, thus the second nanostructures 102a may have different dimensions (i.e., non-uniform channel size on width/thickness), which in turn produces a $V_t$ variation in the nano-FET and causes issues for the CMOS circuit design.

Therefore, the present disclosure in various embodiments provides an etching process P2 (see FIGS. 5A-5C) on the fin structure 120a prior to the channel releasing process. The etching process P2 can trim the fin structure 120a to form a reverse-tapered cross-sectional profile P (see FIG. 5C). In some embodiments, the reverse-tapered cross-sectional profile P can be interchangeably referred to as a reverse-trapezoidal cross-sectional profile. Furthermore, the higher the second nanostructure 102a, the greater the thickness thereof in the fin structure 120a (see FIGS. 5B and 5C, e.g., thickness t2 is greater than thickness t1). The thickness difference between the second nanostructures 102a results from the different deposition steps of forming second semiconductor layers 102. It is note that, a subsequent etching process shown in FIGS. 11A-11C for removing the first and third nanostructures 101a and 103a (i.e., channel releasing process) may unintentionally trim the second nanostructures 102a, and an etching rate thereof will decrease from fin top to fin bottom, which means the higher the second nanostructure 102a is positioned, the more the dimension reduction takes place on the second nanostructure 102a in the unintentionally trimming. However, because of the reverse-tapered profile P, the higher the second nanostructure 102a is positioned, the larger the second nanostructure 102a is. Therefore, the dimension difference between second nanostructures 102a can serve as a balance that aids in counteracting the dimension reduction difference (i.e., etch rate difference) caused by the channel releasing etching process. Therefore, after performing the channel releasing etching process on the reverse-tapered profile P, dimension differences (e.g., width/thickness difference) between the second nanostructures 102a can be reduced, thereby improving the dimension uniformity among the second nanostructures 102a, such that a Vt difference between any two of the second nanostructures 102a can be reduced, and $I_{ON}$ per footprint in the nano-FET can be improved.

Figure 5A:
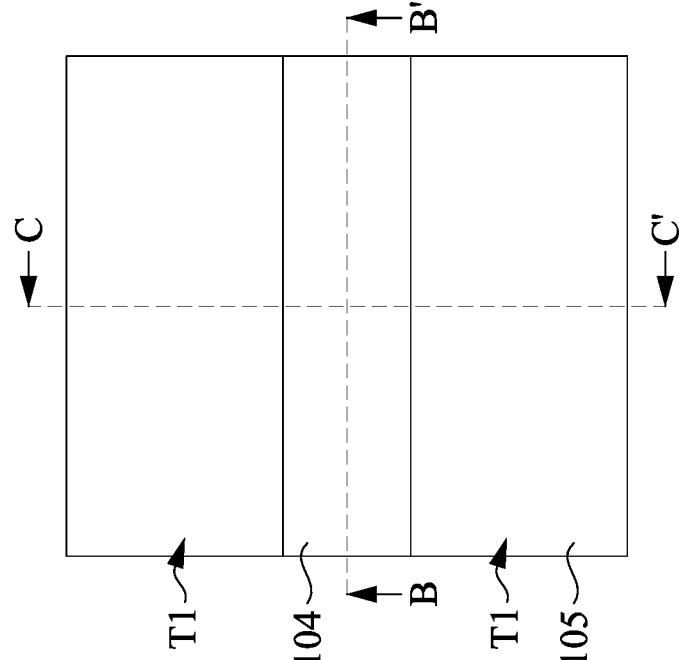
Figures 5B, 5C:
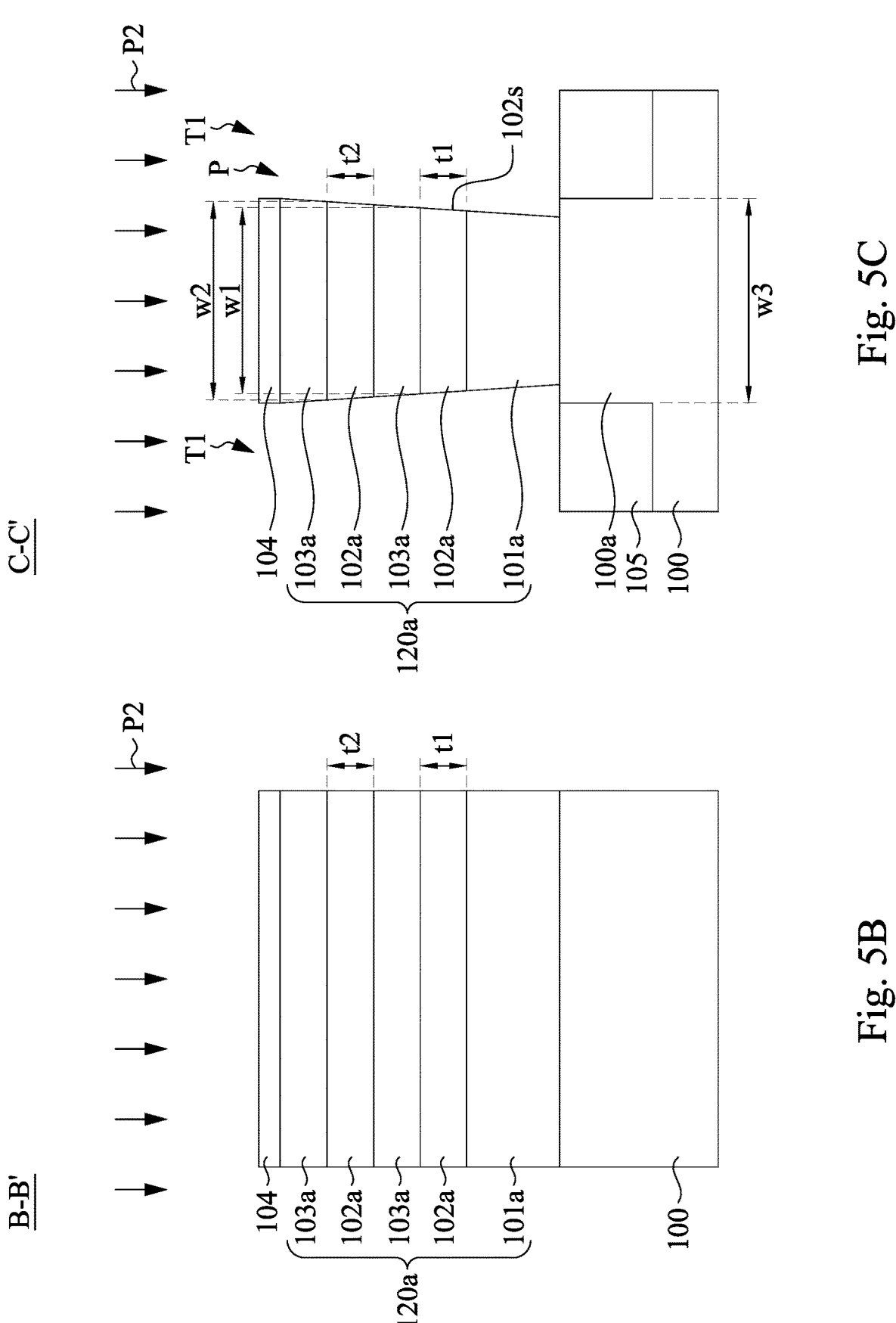

Reference is made to FIGS. 5A, 5B, and 5C. A second etching process P2 is performed on the fin structure 120a to trim the fin structure 120a as a reverse-tapered profile P when viewed in a cross-section taken along a direction perpendicular to longitudinal axes of the second nanostructures 102a. In some embodiments, the second etching process P2 may be a dry etch, such as a reactive ion etch (RIE) process. Therefore, the reverse-taper fin structure can be formed by a two-step RIE process including the first etching process P1 (see FIGS. 3A-3C) and the second etching process P2 (see FIGS. 5A-5C). An etching rate of the second etching process P2 performed on the fin structure 120a increases as a distance downwardly from a top end of the fin structure 120a increases. A variation of the etching rate of the second etching process P2 on the fin structure 120a in different level heights can be controlled by the composition of the fin structure 120a and/or pressure/etchant species of the second etching process P2.

Specifically, the higher the germanium atomic concentration in the fin structure 120a, the greater etching rate of the second etching process P2. In some embodiments, the first and third nanostructures 101a and 103a may be made of silicon germanium, and the second nanostructures 102a may be made of silicon. The first nanostructure 101a may have a greater germanium atomic concentration than the third nanostructures 103a. By way of example and not limitation, the third nanostructures 103a may have a germanium concentration in the range of about 5 atomic percent to about 30 atomic percent, such as about 5, 10, 15, 20, 25, 30, or 40 atomic percent. In some embodiments, the first nanostructure 101a may have a germanium concentration in the range of about 0 atomic percent to about 100 atomic percent, such as about 10, 20, 30, 40, 50, 60, 70, 80, 90, or 100 atomic percent. In some embodiments, the first nanostructure 101a may have a graded germanium atomic concentration decreasing as a distance from a top surface of the substrate 50 increases. In some embodiments, one of the third nanostructures 103a in a lower position may have a greater germanium atomic concentration than another one of the third nanostructures 103a in a higher position.

In some embodiments, the third nanostructures 103a made of silicon germanium may serve as mask layers to underlying second nanostructures 102a made of silicon. Therefore, when the third nanostructures 103a are shortened to expose the underlying second nanostructure 102a, the third nanostructure 103a cannot protect the exposed second nanostructure 102a, so that the exposed second nanostructure 102a will be etched subsequently. In some embodiments, after the second etching process P2, the second nanostructure 102a can have slant sidewalls 102s coterminous with sidewalls of the third nanostructures 103a as shown in FIG. 5C.

In some embodiments, the second etching process P2 may be performed by using a gas mixture of a chlorine-containing gas and a bromine-containing gas as the etching gas. Compared with the first etching process P1, the etching gas of the etching process P2 can use bromine-containing gas, while the first etching process P1 does not use bromine-containing gas. By way of example and not limitation, the second etching process P2 may be performed by using $Cl_2$/HBr as the etching gas. In some embodiments, the second etching process P2 may be performed under a pressure higher than the first etching process P1 as shown in FIGS. 3A-3C. By way of example and not limitation, the pressure of the second etching process P2 may be in a range from about 8 to 12 Torr, such as about 8, 9, 10, 11, or 12 Torr. Because components in the etching gas of the second etching process P2 are in a high pressure state, which in turn increases the chance of collision with each other, so that the second etching process P2 tends to be isotropic.

The composition of the fin structure 120a and pressure/etchant species of the second etching process P2 result in the etching rate of the second etching process P2 on the fin structure 120a that increases as a distance downwardly from a top end of the fin structure 120a increases, thereby forming the reverse-tapered profile P when viewed in the direction perpendicular to the longitudinal axes of the second nanostructures 102a. Therefore, as shown in FIG. 5C, a lower one of the second nanostructures 102a may have a width w1 narrower than a width w2 of an upper one of the second nanostructures 102a. Specifically, a lower one of the second nano structures 102a has a maximal lateral dimension smaller than a maximal lateral dimension of an upper one of the second nanostructures 102a. In some embodiments, when viewed in the direction perpendicular to the longitudinal axes of the second nanostructures 102a, a maximum lateral dimension of a lower one of the second nanostructure 102a is less than a lateral minimum dimension of an upper one of the second nanostructures 102a next to the lower one of the second nanostructures 102a. In some embodiments, the second nanostructures 102a each may have a slant sidewall 102s. Therefore, a lateral dimension in a lower position of one of the second nanostructures 102a may be less than another lateral dimension in an upper position of the same one of the second nanostructures 102a. In some embodiments, the second etching process P2 would minimal consume the fin strip 100a, and thus when viewed in the direction perpendicular to the longitudinal axes of the second nanostructures 102a, the fin strip 100a has a greater lateral dimension w3 than the second nanostructures 102a.

Figure 6A:
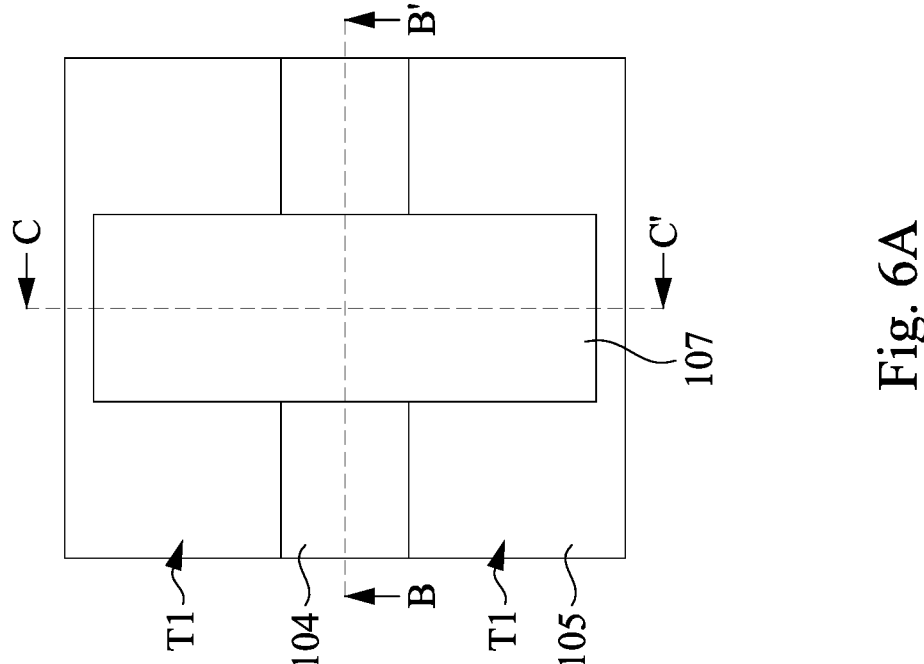
Figures 6B, 6C:
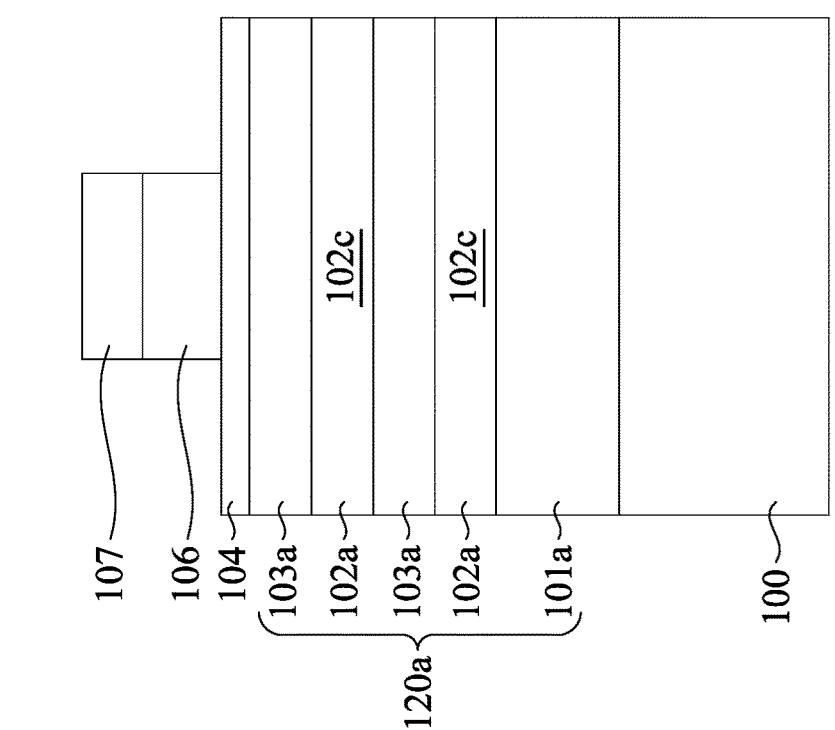

Reference is made to FIGS. 6A, 6B, and 6C. A dummy gate layer is formed on the fin strip 100a and the first, second, and third nanostructures 101a, 102a, and 103a. The dummy gate layer which will form a dummy gate 106 including a dummy gate dielectric layer and a dummy gate electrode layer over the dummy gate dielectric layer. The dummy gate dielectric layer may be formed of a dielectric material such as silicon oxide, silicon nitride, a combination thereof, or the like, which may be deposited or thermally grown according to acceptable techniques. The dummy gate electrode layer may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like.

Subsequently, a pattern of a hard mask layer 107 formed on the dummy gate layer is transferred to the dummy gate layer by any acceptable etching technique to form the dummy gate 106. The dummy gate 106 covers portions of the first, second, and third nanostructures 101a, 102a, and 103a that will be exposed in subsequent processing to form channel regions. Specifically, the dummy gate 106 extends along the portions of the second nanostructures 102a that will be patterned to form channel regions 102c (see FIG. 6B). The dummy gate 106 may also have a lengthwise direction substantially perpendicular (within process variations) to a lengthwise direction of the fin strip 100a. The hard mask layer 107 can optionally be removed after patterning, such as by any acceptable etching technique. In some embodiments, the hard mask layer 107 may be formed of a dielectric material such as silicon nitride, silicon oxynitride, silicon oxycarbonitride (SiOCN), the like, or a combination thereof.

Figure 7A:
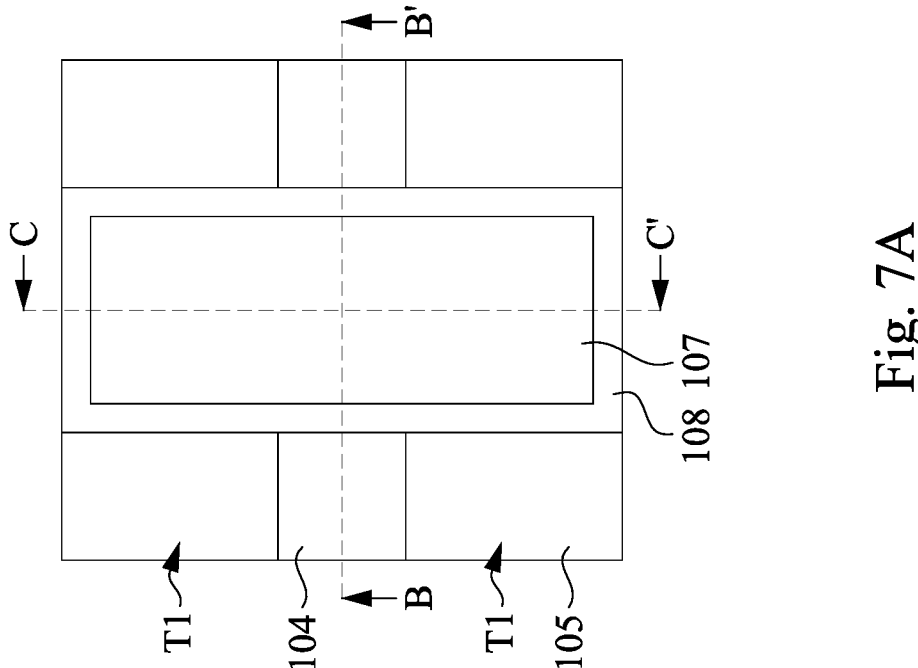
Figures 7B, 7C:
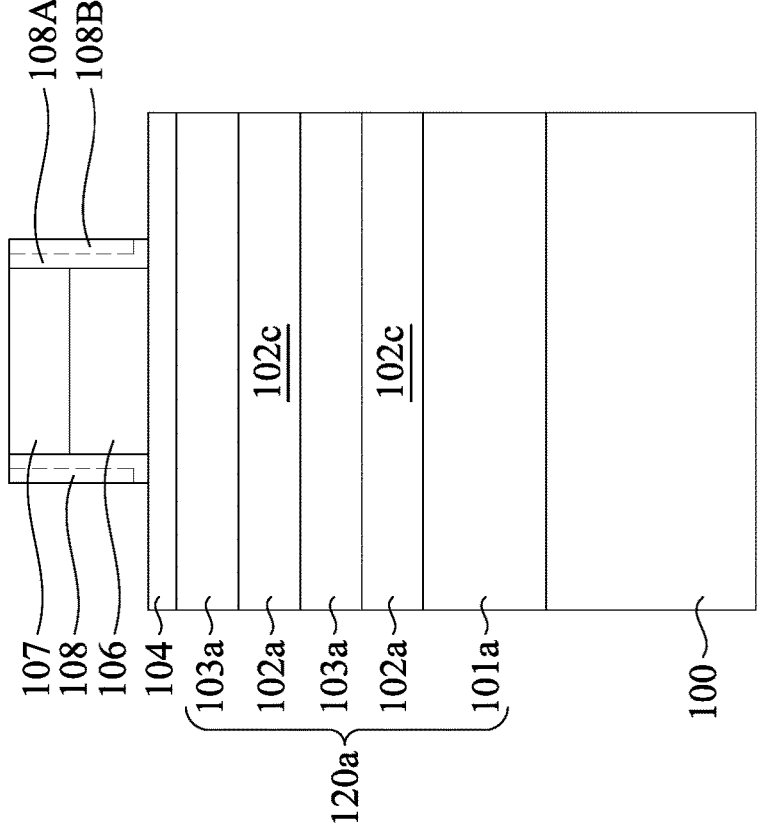

Reference is made to FIGS. 7A, 7B, and 7C. Gate spacers 108 are formed over the first, second, and third nanostructures 101a, 102a, and 103a and the hard mask layer 104 and on exposed sidewalls of the dummy gate 106 and the hard mask layer 107. The gate spacers 108 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. In some embodiments, the gate spacers 108 each include multiple layers, e.g., a first spacer layer 108A and a second spacer layer 108B (see FIG. 7B). In some embodiments, the first spacer layers 108A and the second spacer layers 108B are formed of silicon oxycarbonitride (e.g., $SiO_xN_yC_{1-x-y}$, where x and y are in the range of 0 to 1), with the first spacer layers 108A formed of a similar or a different composition of silicon oxycarbonitride than the second spacer layers 108B. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gate 106 (thus forming the gate spacers 108). After etching, the gate spacers 108 can have straight sidewalls (as illustrated) or can have curved sidewalls (not separately illustrated).

Figure 8A:
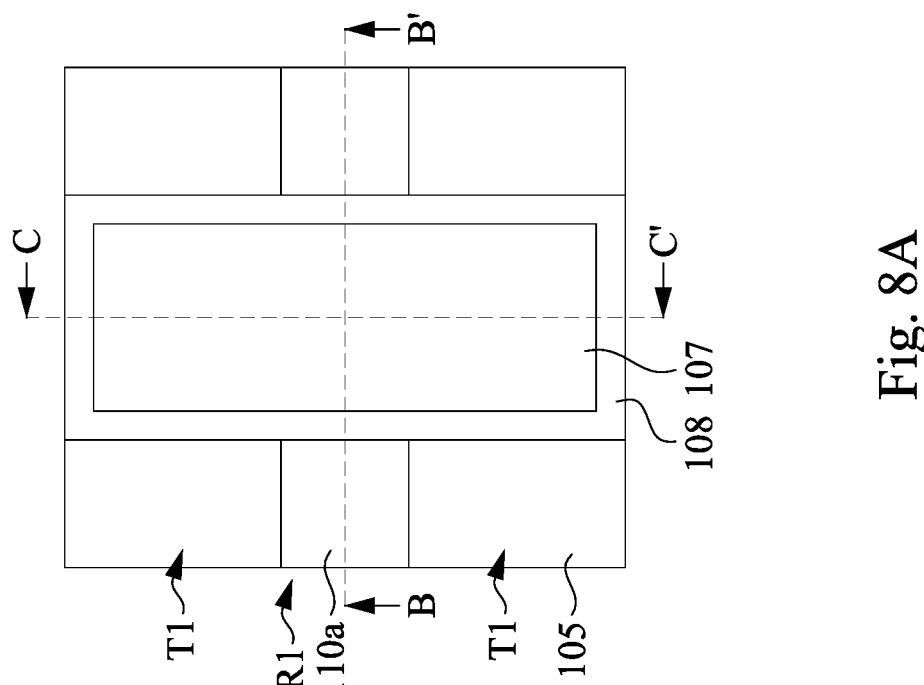
Figures 8B, 8C:
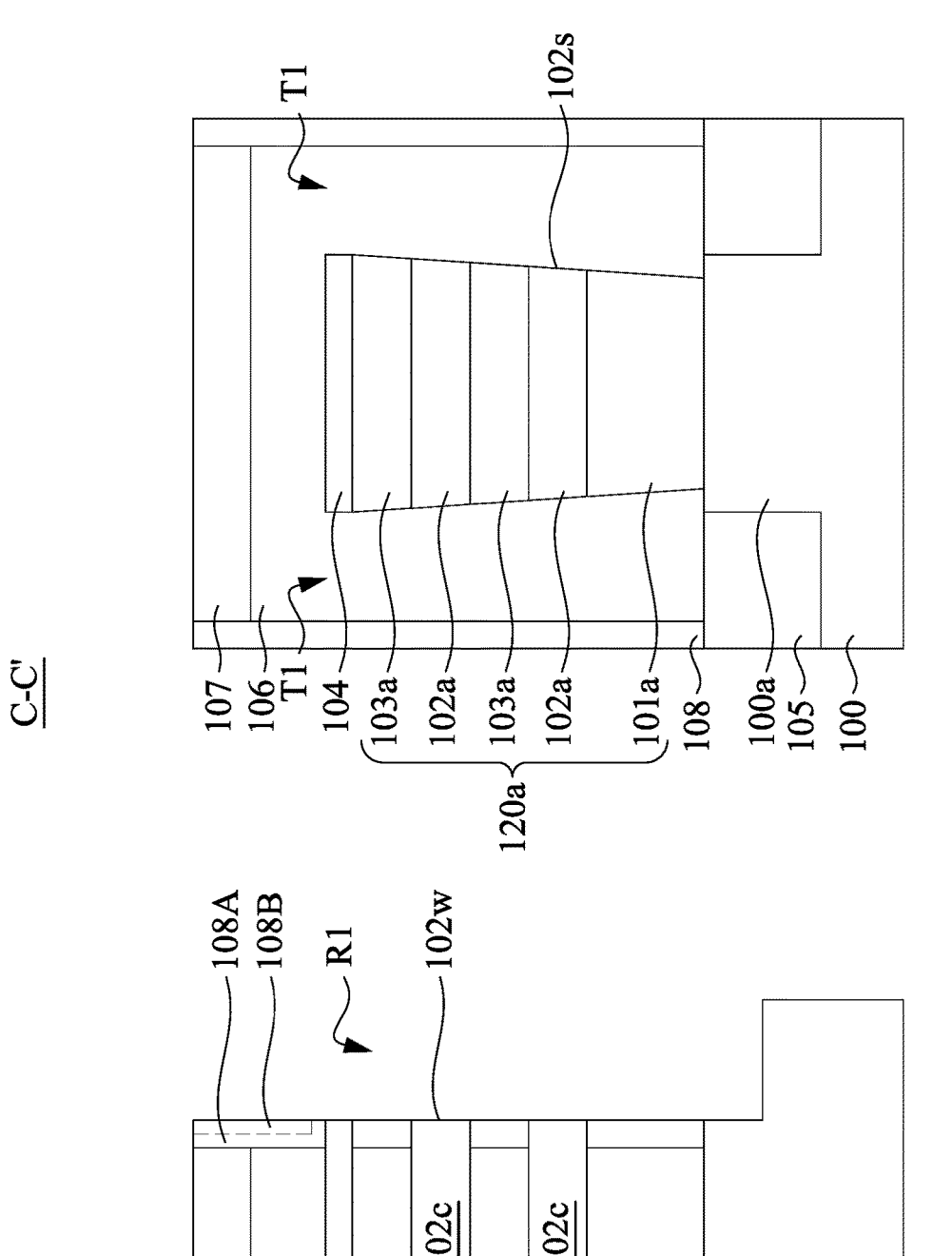

Reference is made to FIGS. 8A, 8B, and 8C. Source/drain recesses R1 are formed in the first, second, and third nanostructures 101a, 102a, and 103a. In some embodiments, the source/drain recesses R1 extend through the first, second, and third nanostructures 101a, 102a, and 103a and to the top surface of the fin strip 100a without etching the fin strip 100a. In some embodiments, the source/drain recesses R1 may also extend into the fin strip 100a, such that bottom surfaces of the source/drain recesses R1 are disposed below the top surfaces of the STI region 105; or the like. The source/drain recesses R1 may be formed by etching the first, second, and third nanostructures 101a, 102a, and 103a using an dry etching process, such as a RIE, a NBE, or the like. In some embodiments, the etching may be anisotropic. The gate spacers 108 and the dummy gate 106 collectively mask portions of the fin strip 100a and/or the first, second, and third nanostructures 101a, 102a, and 103a during the etching processes used to form the source/drain recesses R1. A single etch process may be used to etch each of the first, second, and third nanostructures 101a, 102a, and 103a, or multiple etch processes may be used to etch the first, second, and third nanostructures 101a, 102a, and 103a. Timed etch processes may be used to stop the etching of the source/drain recesses R1 after the source/drain recesses R1 reach a desired depth.

Optionally, inner spacers 109 are formed on the sidewalls of the remaining portions of the first and third nanostructures 101a and 103a, e.g., those sidewalls exposed by the source/drain recesses R1. As will be subsequently described in greater detail, source/drain regions will be subsequently formed in the source/drain recesses R1, and the first and third nanostructures 101a and 103a will be subsequently replaced with corresponding gate structures. The inner spacers 109 act as isolation features between the subsequently formed source/drain regions and the subsequently formed gate structures. Further, the inner spacers 109 may be used to substantially prevent damage to the subsequently formed source/drain regions by subsequent etching processes, such as etching processes used to subsequently remove the first and third nanostructures 101a and 103a.

As an example to form the inner spacers 109, the source/drain recesses R1 can be laterally expanded. Specifically, portions of the sidewalls of the first and third nanostructures 101a and 103a exposed by the source/drain recesses R1 may indent relative to sidewalls 102w (see FIG. 8B) of the second nanostructures 102a. Although sidewalls of the first and third nanostructures 101a and 103a are illustrated as being straight, the sidewalls may be concave or convex. The sidewalls may be recessed by any acceptable etching process, such as one that is selective to the material of the first and third nanostructures 101a and 103a (e.g., selectively etches the material of the first and third nanostructures 101a and 103a at a faster rate than the material of the second nanostructures 102a). In some embodiments, portions of the nanostructures 102a adjacent to the second nanostructures 102a may be etched. The etching may be isotropic. For example, when the second nanostructures 102a are formed of silicon and the first and third nanostructures 101a and 103a are formed of silicon germanium, the etching process may be a wet etch using tetramethylammonium hydroxide (TMAH), ammonium hydroxide ($NH_4OH$), or the like. In some embodiments, the etching process may be a dry etch using a fluorine-based gas such as hydrogen fluoride (HF) gas. In some embodiments, the same etching process may be continually performed to both form the source/drain recesses R1 and recess the sidewalls of the first and third nanostructures 101a and 103a.

Subsequently, the inner spacers 109 can be formed by conformally forming an insulating material and subsequently etching the insulating material. The insulating material may be silicon nitride, silicon carbon nitride (SiCN), silicon oxycarbonitride (SiOCN), silicon oxynitride, or any suitable material, such as low-dielectric constant (low-k) materials having a k-value less than about 3.5, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 109 are illustrated as being flush with respect to the sidewalls of the gate spacers 108, the outer sidewalls of the inner spacers 109 may extend beyond or be recessed from the sidewalls of the gate spacers 108. In other words, the inner spacers 109 may partially fill, completely fill, or overfill the sidewall recesses. Moreover, although the sidewalls of the inner spacers 109 are illustrated as being straight, the sidewalls of the inner spacers 109 may be concave or convex.

Figure 9A:
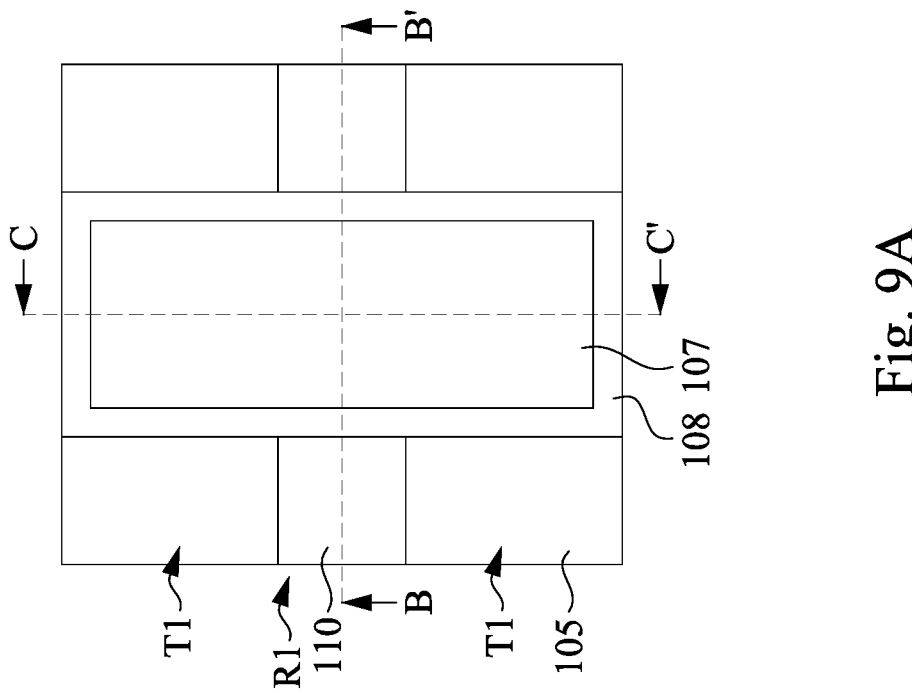
Figures 9B, 9C:
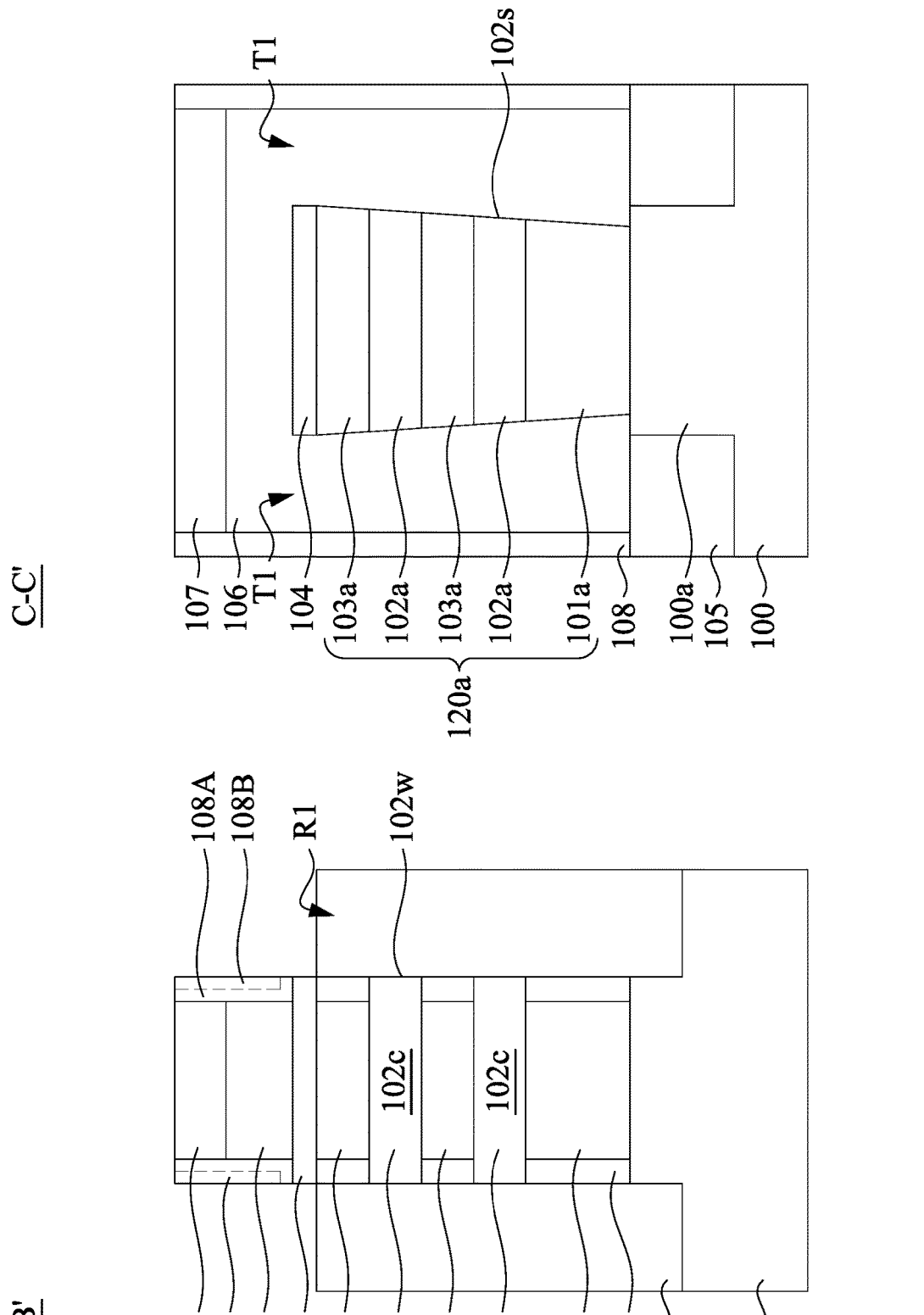

Reference is made to FIGS. 9A, 9B, and 9C. Epitaxial source/drain regions 110 are formed in the source/drain recesses R1. The epitaxial source/drain regions 110 are formed in the source/drain recesses R1 such that each dummy gate 106 (and corresponding channel regions 102c) is disposed between the epitaxial source/drain regions 110. In some embodiments, the gate spacers 108 and the inner spacers 109 are used to separate the epitaxial source/drain regions 110 from, respectively, the dummy gate 106 and the second nanostructures 102a by an appropriate lateral distance so that the epitaxial source/drain regions 110 do not short out with subsequently formed gates of the resulting nano-FETs. A material of the epitaxial source/drain regions 110 may be selected to exert stress in the respective channel regions 102c, thereby improving performance.

The epitaxial source/drain regions 110 are epitaxially grown in the source/drain recesses R1. The epitaxial source/drain regions 110 may include any acceptable material appropriate for, such as n-type devices. For example, the epitaxial source/drain regions 110 in the n-type region may include materials exerting a tensile strain on the channel regions 102c, such as silicon, silicon carbide, phosphorous doped silicon carbide, silicon phosphide, or the like. The epitaxial source/drain regions 110 in the n-type region may be referred to as "n-type source/drain regions." The epitaxial source/drain regions 110 may include any acceptable material appropriate for, such as p-type devices. For example, the epitaxial source/drain regions 110 in the p-type region may include materials exerting a compressive strain on the channel regions 102c, such as silicon germanium, boron doped silicon germanium, germanium, germanium tin, or the like. The epitaxial source/drain regions 110 in the p-type region may be referred to as "p-type source/drain regions." The epitaxial source/drain regions 110, the second nanostructures 102a, and/or the fin strip 100a may be implanted with impurities, followed by an annealing process. The source/drain regions may have an impurity concentration in the range of about $10^{19}$ cm$^{-3}$ to about $10^{21}$ cm$^{-3}$. In some embodiments, the epitaxial source/drain regions 110 may be in situ doped during growth. The epitaxial source/drain regions 110 may have surfaces raised from respective surfaces of the fin strip 100a and the first, second, and third nanostructures 101a, 102a, and 103a, and may have facets.

Figure 10A:
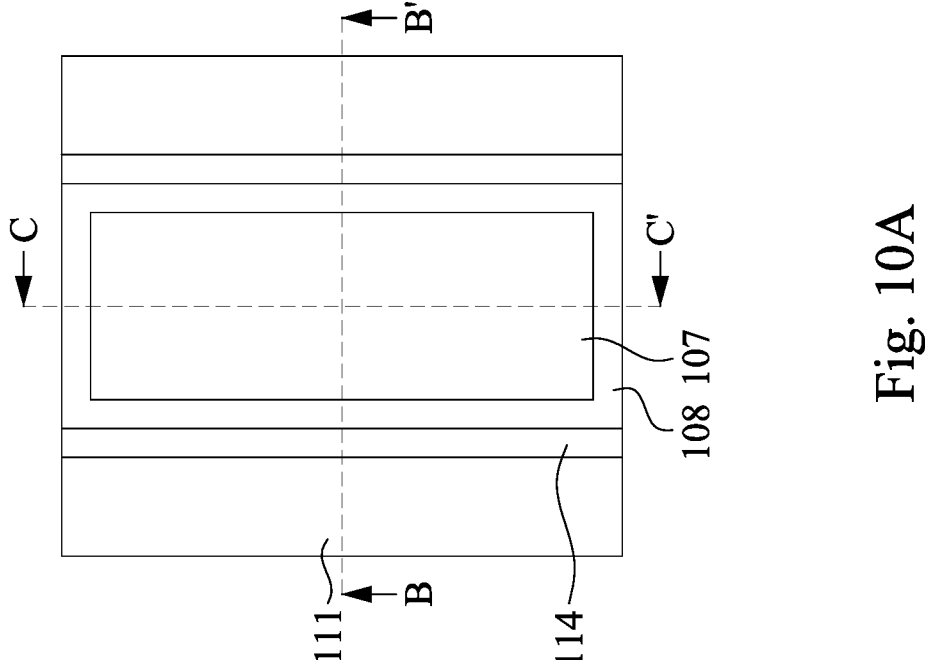
Figures 10B, 10C:
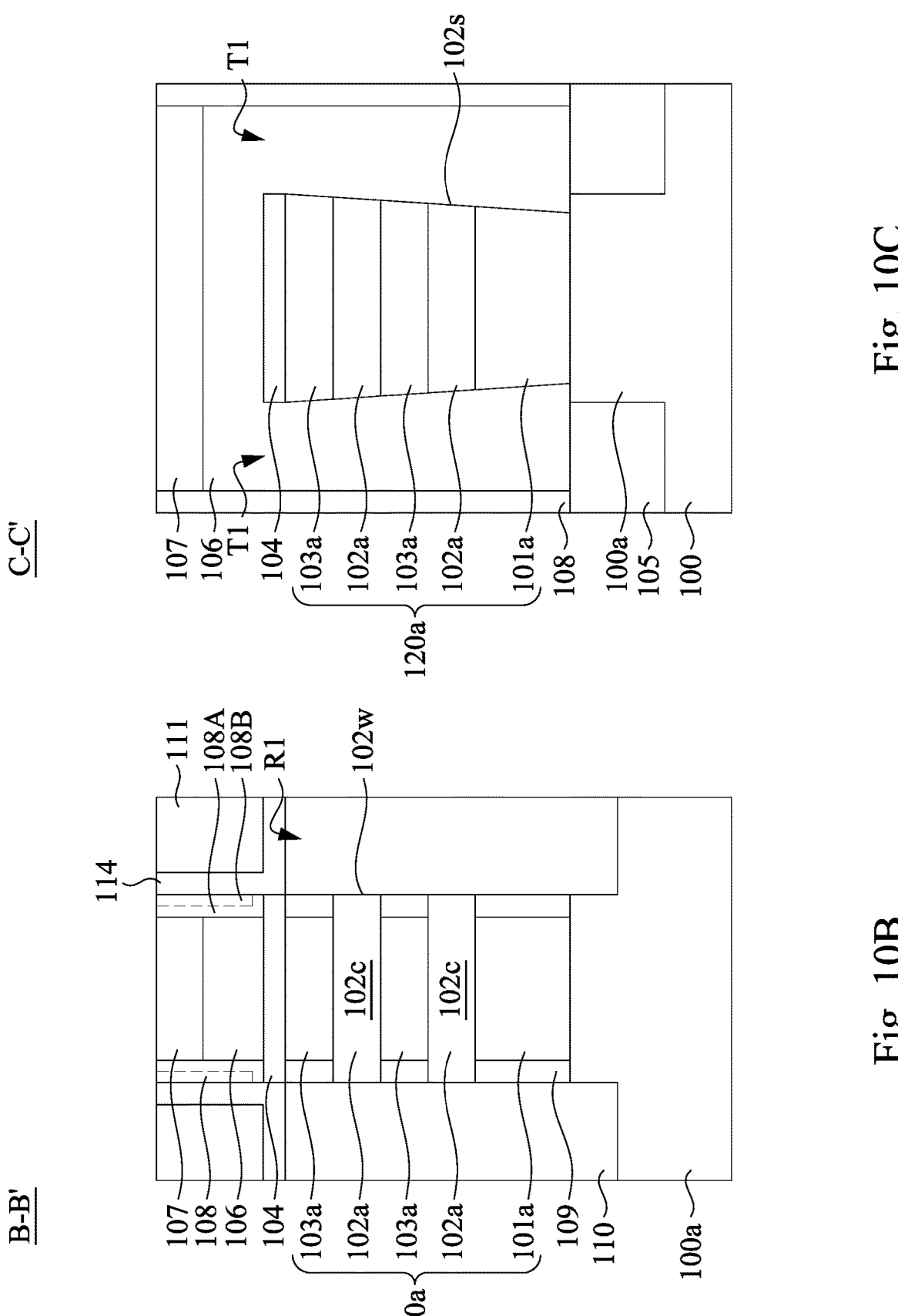

Reference is made to FIGS. 10A, 10B, and 10C. An inter-layer dielectric (ILD) layer 111 is deposited over the epitaxial source/drain regions 110, the gate spacers 108, the hard mask layer 107, and the dummy gate 106. The ILD layer 111 may be formed of a dielectric material, which may be deposited by any suitable method, such as CVD, plasma-enhanced CVD (PECVD), FCVD, or the like. Acceptable dielectric materials may include silicon oxide, silicon nitride, phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 114 may be formed between the ILD layer 111 and the epitaxial source/drain regions 110, the gate spacers 108, and the hard mask layer 107 or the dummy gate 106. The CESL 114 may be formed of a dielectric material, such as silicon nitride, silicon oxide, silicon oxynitride, or the like, having a high etching selectivity from the etching of the ILD layer 111. The CESL 114 may be formed by an any suitable method, such as CVD, ALD, or the like.

Subsequently, a removal process is performed to level the top surface of the ILD layer 111 with the top surface of the hard mask layer 107 or the dummy gate 106. In some embodiments, a planarization process such as a chemical mechanical polish (CMP), an etch-back process, combinations thereof, or the like may be utilized. The planarization process may also remove the hard mask layer 107 on the dummy gate 106, and portions of the gate spacers 108 along sidewalls of the hard mask layer 107. After the planarization process, the top surfaces of the gate spacers 108, the ILD process, the top surfaces of the gate spacers 108, the ILD layer 111, the CESL 111, and the hard mask layer 107 or the dummy gate 106 are coplanar (within process variations). Accordingly, the top surface of the hard mask layer 107 or the dummy gate 106 is exposed through the ILD layer 111. In some embodiments, the hard mask layer 107 remains, and the planarization process levels the top surface of the ILD layer 111 with the top surface of the hard mask layer 107.

Figure 11A:
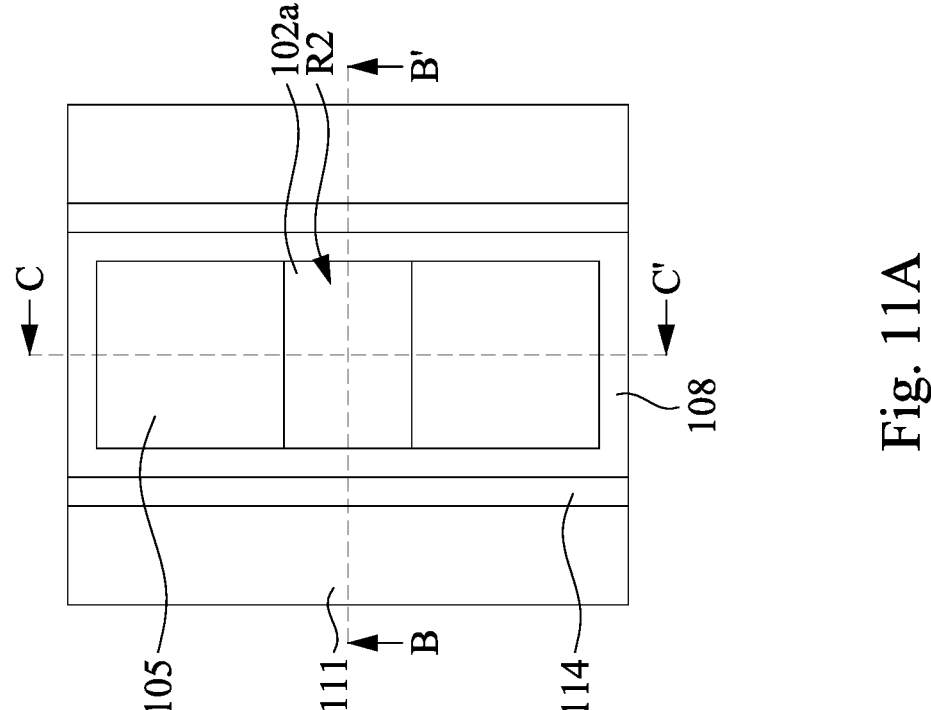
Figure 11C:
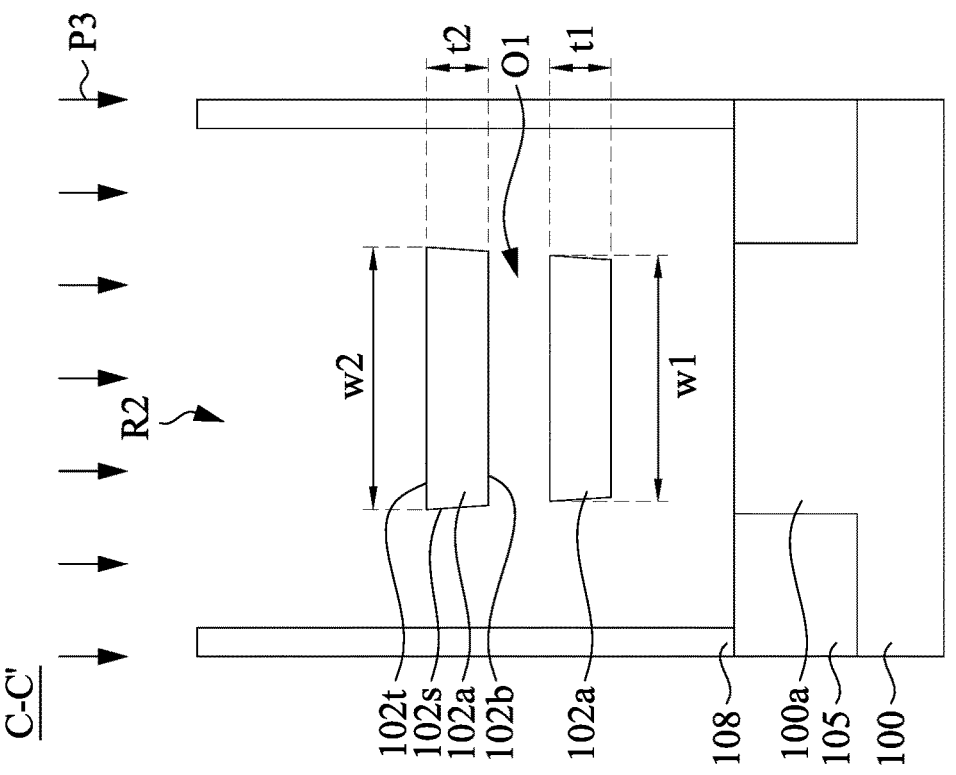
Figure 11B:
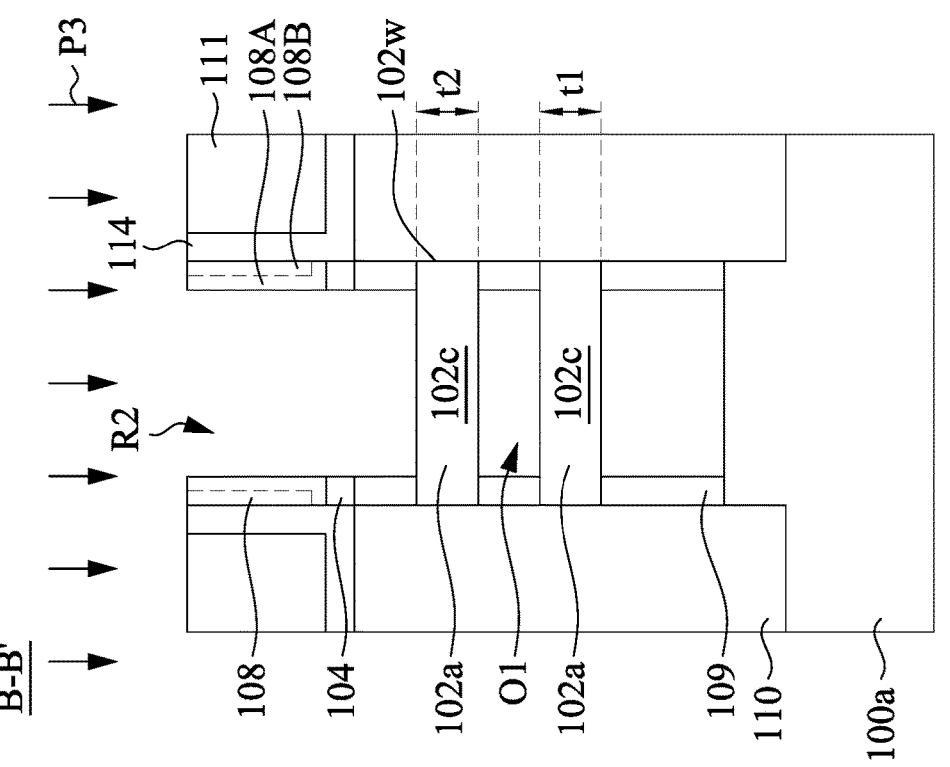

Reference is made to FIGS. 11A, 11B, and 11C. The hard mask layer 107 and the dummy gate 106 are removed in an etching process, so that recesses R2 are formed. In some embodiments, the etching process may be an anisotropic dry etch process. For example, the etching process may include a dry etch process using reaction gas(es) that selectively etch the dummy gate 106 (see FIGS. 10B and 10C) at a faster rate than the ILD layer 111, the CESL 114, and the gate spacers 108. During the removal, the hard mask layer 104 (see FIG. 10B) may be used as etch stop layers when the dummy gate 106 are etched. An exposed portion of the hard mask layer 104 is then removed. The recess R2 exposes and/or overlies portions of the nanostructures 103a.

The remaining portions of the first and second nanostructures 101a and 103a are then removed to expand the recesses R2, such that openings O1 (see FIGS. 11B and 11C) are formed between the second nanostructures 102a. The remaining portions of the first and second nanostructures 101a and 103a (see FIGS. 10B and 10C) can be removed by a third etching process P3 that selectively etches the material of the first and second nanostructures 101a and 103a at a faster rate than the material of the second nanostructures 102a. Therefore, the third etching process P3 can selectively remove the sacrificial nanostructures 101a, 103c, while leaving the nanostructures 102a in the gate trench to serve as channel layers for GAA transistor. The third etching process P3 can be thus interchangeably referred to as a channel releasing process. In some embodiments, the third etching process P3 may be a dry etching process, using such as a fluorine-based gas (e.g., perfluoromethane (CF$_4$) gas), and may be anisotropic. In some embodiments, the third etching process P3 may be isotropic. For example, when the first and second nanostructures 101a and 103a are formed of silicon germanium and the second nanostructures 102a are formed of silicon, the etching process may be a wet etch using tetramethylammonium hydroxide (TMAH), ammonium hydroxide (NH$_4$OH), or the like.

The third etching process P3 may unintentionally trim sidewalls 102s (see FIG. 11C) of the second nanostructures 102a. An etching rate of unintentionally trimming the second nanostructures 102 decreases from a higher position to a lower position, which means the higher the second nanostructure 102a is positioned, the more the width reduction takes place on the second nanostructure 102a in the unintentionally trimming. However, because of the reverse-tapered profile, the higher the second nanostructure 102a is positioned, the wider the second nanostructure 102a is. Therefore, the width difference resulting from the reverse-tapered profile can serve as a balance that aids in counteracting the dimension reduction difference (i.e., etch rate difference) caused by the channel releasing etching process. Therefore, after performing the third etching process P3 on the reverse-tapered profile P (see FIG. 5C), a width difference the second nanostructures 102a can be reduced, thereby improving the dimension uniformity among the second nanostructures 102a, such that a Vt difference between the second nanostructures 102a can be reduced and IO N per footprint in the nano-FET can be improved. In some embodiments, after the third etching process P3, the width w1 of the lower one of the second nanostructures 102a may be narrower than but close to the width w2 of the upper one of the second nanostructures 102*a*, so that a Vt difference in the nano-FET can be negligible. In some embodiments, after the third etching process P3, the width w1 of the lower one of the second nanostructures 102*a* may be substantially the same as the width w2 of the upper one of the second nanostructures 102*a*.

In some embodiments, before the third etching process P3, the higher the second nanostructure 102*a*, the greater the thickness thereof in the fin structure 120*a*. For example, the lower one of the second nanostructures 102*a* has the thickness t1 thinner than the thickness t2 of the upper one of the second nanostructures 102*a*. Furthermore, an etching rate of unintentionally trimming the second nanostructures 102*a* caused by the third etching process P3 decreases from a higher position to a lower position, which means the higher the second nanostructure 102*a* is positioned, the more the thickness reduction takes place on the second nanostructure 102*a* in the third etching process P3. However, the upper nanostructure thickness t2 is larger than the lower nanostructure thickness t1, and thus the thickness difference can serve as a balance that aids in counteracting the thickness reduction difference (i.e., etch rate difference) caused by the third etching process P3. Therefore, after performing the third etching process P3 on the fin structure 120*a*, a thickness difference between the second nanostructures 102*a* can be reduced, thereby improving the dimension uniformity among the second nanostructures 102*a*, such that a Vt difference between any two of the second nanostructures 102*a* can be reduced and $I_{ON}$ per footprint in the nano-FET can be improved. In some embodiments, after the third etching process P3, the thickness t1 of the lower one of the second nanostructures 102*a* may be thinner than but close to the thickness t2 of the upper one of the second nanostructures 102*a*, so that a Vt difference in the nano-FET can be negligible. In some embodiments, after the third etching process P3, the thickness t1 of the lower one of the second nanostructures 102*a* may be substantially the same as the thickness t2 of the upper one of the second nanostructures 102*a*.

Figure 12A:
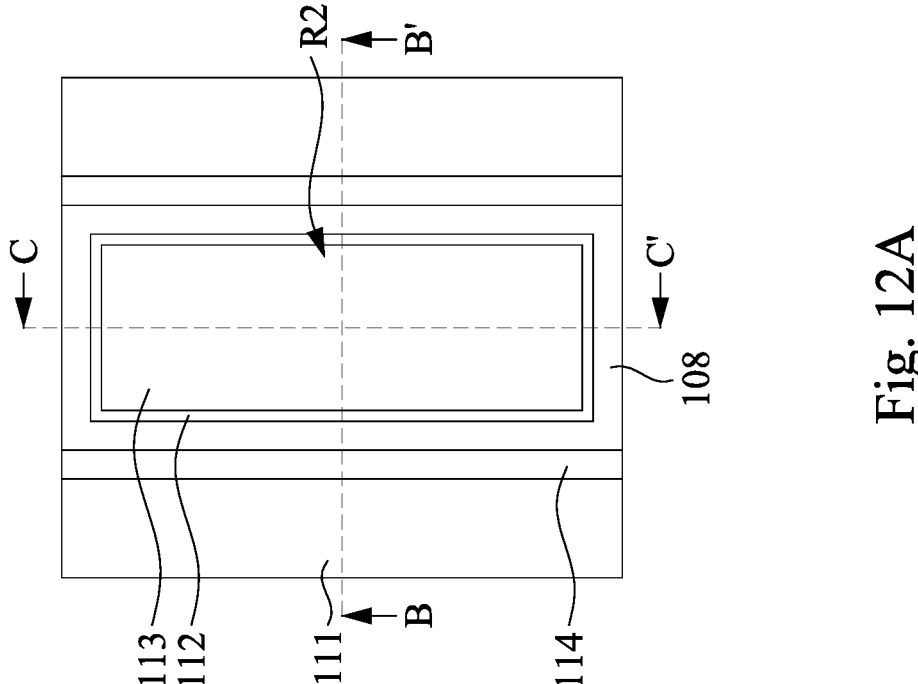
Figure 12C:
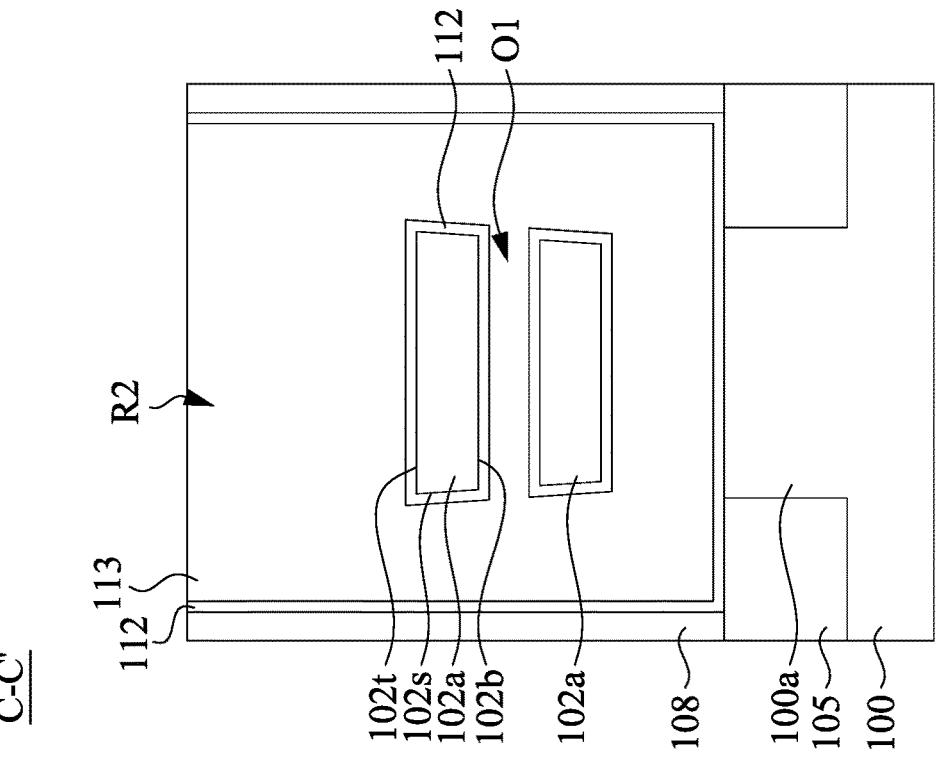
Figure 12B:
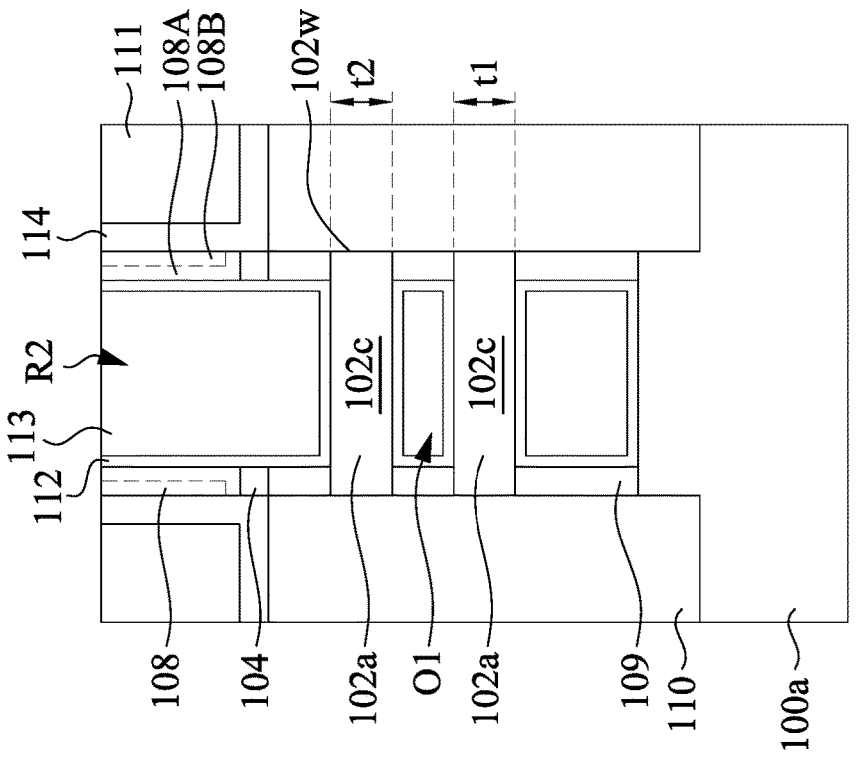

Reference is made to FIGS. 12A-12C. A gate dielectric layer 112 is formed in the recesses R2. A gate electrode layer 113 is formed on the gate dielectric layer 112. The gate dielectric layer 112 and the gate electrode layer 113 are layers for replacement gates, and each wrap around all (e.g., four) sides of the second nanostructures 102*a* (see FIG. 12C).

The gate dielectric layer 112 is disposed on the top surface of the fin strip 100*a*; on the top surfaces 102*t*, the sidewalls 102*s*, and the bottom surfaces 102*b* of the second nanostructures 102*a*; and on the sidewalls of the gate spacers 108. The gate dielectric layer 112 may also be formed on the top surfaces of the ILD 111 and the gate spacers 108. The gate dielectric layer 112 may include an oxide such as silicon oxide or a metal oxide, a silicate such as a metal silicate, combinations thereof, multi-layers thereof, or the like. The gate dielectric layer 112 may include a dielectric material having a k-value greater than about 7.0, such as a metal oxide or a silicate of hafnium, aluminum, zirconium, lanthanum, manganese, barium, titanium, lead, and combinations thereof. Although a single-layered gate dielectric layer 112 is illustrated in FIGS. 12A-12C, the gate dielectric layer 112 may include any number of interfacial layers and any number of main layers.

The gate electrode layer 113 may include a metal-containing material such as titanium, titanium nitride, titanium oxide, tungsten, cobalt, ruthenium, aluminum, combinations thereof, multi-layers thereof, or the like. Although a single-layered gate electrode layer 113 is illustrated in FIGS. 12A-12C, the gate electrode layer 113 may include any number of work function tuning layers, any number of barrier layers, any number of glue layers, and a fill material.

Figure 11D:
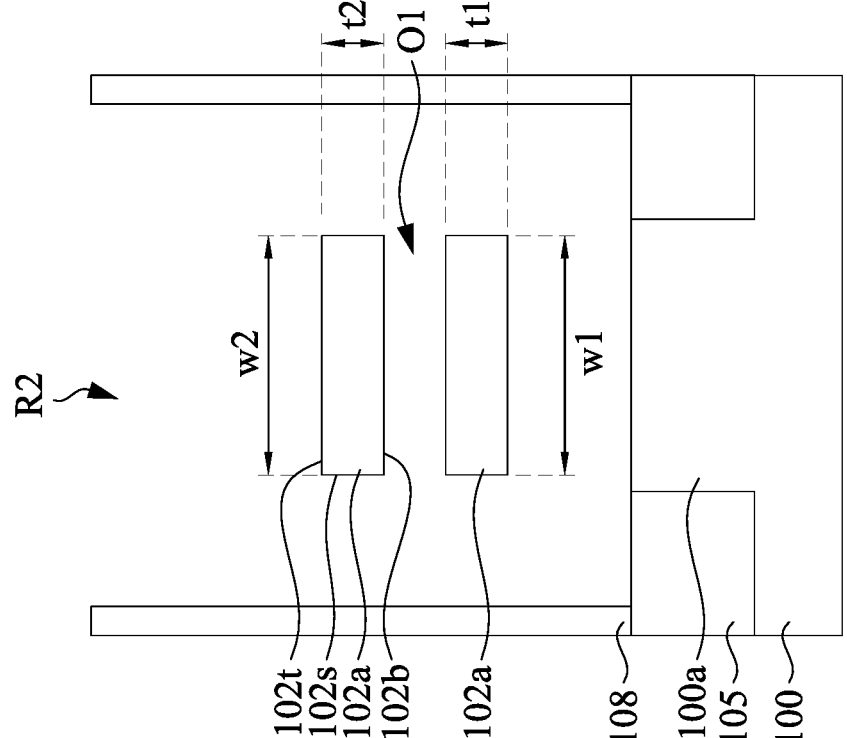
Figure 12D:
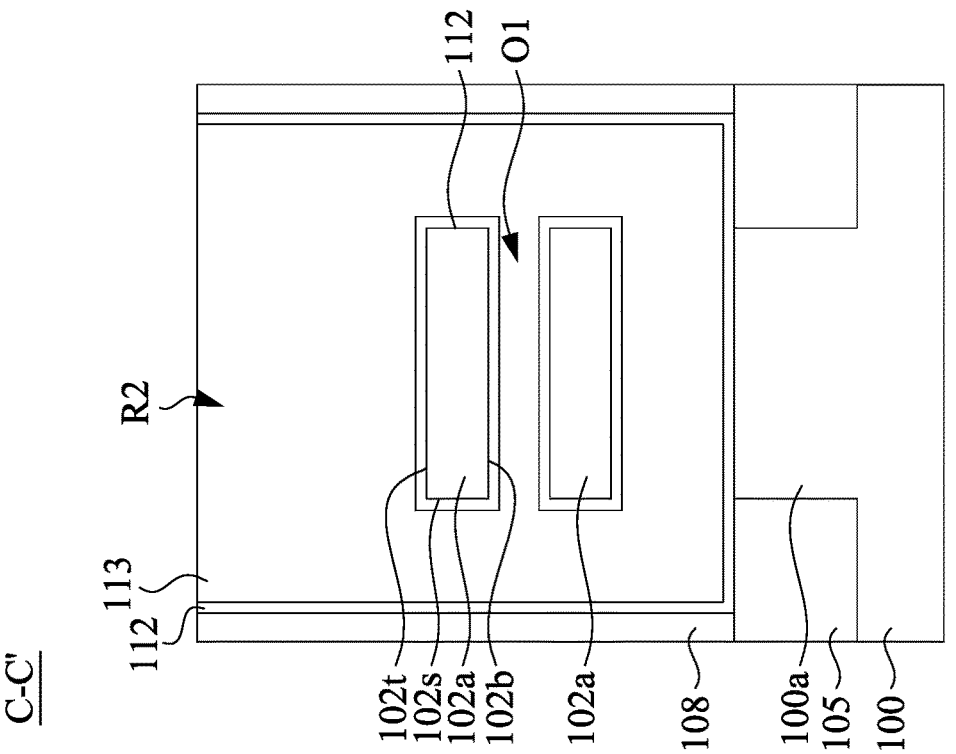

Reference is made to FIGS. 11D and 12D. FIG. 11D illustrates another nano-FET at a stage corresponding to FIGS. 11A-11C according to some alternative embodiments of the present disclosure to illustrate different profiles of second nanostructures (i.e., channel layers) after the third etching process P3. FIG. 12D illustrates another nano-FET at a stage corresponding to FIGS. 12A-12C according to some alternative embodiments of the present disclosure to illustrate different profiles of nano-FET after forming the replacement gates.

As shown in FIG. 11D, after the third etching process P3, the second nanostructures 102*a* may be consumed, such that when viewed in the direction perpendicular to longitudinal axes of the second nanostructures 102*a*, any two of the nanostructures 102*a* may substantially have a same lateral dimension as each other or a same thickness as each other. In some embodiments, the second nanostructures 102*a* each may have a vertical side surface as shown in FIG. 11D. Therefore, the dimension uniformity among the second nanostructures 102*a* may be improved, which in turns minimizes a Vt difference between any two of the second nanostructures 102*a* and maximizes $I_{ON}$ per footprint in the nano-FET. As shown in FIG. 12D, after forming the gate dielectric layer 112 and the gate electrode layer 113 of the replacement gates, the gate dielectric layer 112 lines vertical sidewalls 102*s* of the second nanostructures 102*a*. In some embodiments, vertical portions of the gate dielectric layer 112 on the second nanostructures 102*a* may overlap with each other and may have a same vertical dimension as each other.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the channel dimension uniformity of a GAA FET can be improved. Another advantage is that the on-current ($I_{ON}$) can be increased because of the improved channel dimension uniformity.

In some embodiments, a method includes forming a semiconductor structure on a substrate; performing a first etching process on the semiconductor structure to form a fin structure upwardly extending above the substrate; performing a second etching process to trim the fin structure to have a reverse-trapezoidal cross-sectional profile; forming source/drain regions on opposite regions of the fin structure; forming a gate structure between the source/drain regions. In some embodiments, the second etching process is performed under a pressure higher than the first etching process. In some embodiments, the second etching process is performed by using a gas mixture including a bromine-containing gas, but the first etching process does not use the bromine-containing gas. In some embodiments, the method further includes forming a shallow trench isolation structure around a lower portion of the fin structure after performing the first etching process and prior to performing the second etching process. In some embodiments, forming the semiconductor structure on the substrate comprises alternately depositing sacrificial materials and channel materials to form a multi-layer stack on the substrate, and the fin structure comprises alternating sacrificial layers and channel layers, the sacrificial layers comprise remaining portions of the sacrificial materials and the channel layers comprise remaining portions of the channel materials. In some embodiments, a first one of the sacrificial layers in a lower position has a higher germanium atomic concentration than a second one of the sacrificial layers in a higher position. In some embodiments, the first one of the sacrificial layers has a germanium atomic concentration in a range from about 40 to 100 atomic percent, and the second one of the sacrificial layers has a germanium atomic concentration in a range from about 5 to 40 atomic percent. In some embodiments, the germanium atomic concentration of the first one of the sacrificial layers decreases as a distance from the substrate increases. In some embodiments, a first one of the sacrificial layers in a lower position has a thicker thickness than a second one of the sacrificial layers in a higher position.

In some embodiments, A method includes alternately depositing first and second semiconductor layers on a substrate, a first one of the first semiconductor layers in a lower position having a higher germanium atomic concentration than a second one of the first semiconductor layers in a higher position; performing a first etching process on the first and second semiconductor layers to form a fin structure on the substrate under a first pressure, the fin structure having alternating first and second nanostructures, the first nanostructures comprising remaining portions of the first semiconductor layers, and the second nanostructures comprising remaining portions of the second semiconductor layers; performing, using a bromine-containing gas, a second etching process on the fin structure under a second pressure higher than the first pressure; forming epitaxial structures on either side of the fin structure; removing the first nanostructures of the fin structure such that the second nanostructures of the fin structure are suspended over the substrate; forming a gate structure to surround each of the suspended second nanostructures. In some embodiments, the first and second etching processes both are reactive ion etch processes. In some embodiments, the second etching process etching process have an etching rate decreasing from an upper position to a lower position. In some embodiments, the second pressure is in a range from about 8 to 12 Torr. In some embodiments, the bromine-containing gas comprises HBr gas. In some embodiments, the first etching process is performing by using an etching gas without the bromine-containing gas. In some embodiments, after performing the second etching process, a lower portion of the fin structure has a smaller lateral dimension than an upper portion of the fin structure.

In some embodiments, a semiconductor device includes a substrate, source/drain regions, a plurality of channel layers, and a gate structure. The source/drain regions are above the substrate. The channel layers extend in a first direction between the source/drain regions and are arranged in a second direction substantially perpendicular to a top surface of the substrate. When viewed in a cross section taken along a third direction perpendicular to the first direction, a first one of the channel layers has a lateral dimension smaller than a lateral dimension of a second one of the channel layers. The gate structure extends along the third direction and surrounds each of the first and second ones of the channel layers. In some embodiments, the lower one of the channel layers has a smaller thickness than the upper one of the channel layers. In some embodiments, the first one of the channel layers is in a position lower than the second one of the channel layers. In some embodiments, the channel layers each have a slant side surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a semiconductor structure on a substrate;
performing a first etching process on the semiconductor structure under a first pressure to form a fin structure upwardly extending above the substrate;
performing a second etching process using a gas mixture comprising a bromine-containing gas and under a second pressure higher than the first pressure to trim the fin structure to have a reverse-trapezoidal cross-sectional profile, wherein the second pressure is in a range from about 8 to 12 Torr;
forming source/drain regions on opposite regions of the fin structure; and
forming a gate structure between the source/drain regions.

2. The method of claim 1, wherein the first etching process does not use the bromine-containing gas.

3. The method of claim 1, further comprising:
forming a shallow trench isolation structure around a lower portion of the fin structure after performing the first etching process and prior to performing the second etching process.

4. The method of claim 1, wherein forming the semiconductor structure on the substrate comprises alternately depositing sacrificial materials and channel materials to form a multi-layer stack on the substrate, and the fin structure comprises alternating sacrificial layers and channel layers, the sacrificial layers comprise remaining portions of the sacrificial materials and the channel layers comprise remaining portions of the channel materials.

5. The method of claim 4, wherein a first one of the sacrificial layers in a lower position has a higher germanium atomic concentration than a second one of the sacrificial layers in a higher position.

6. The method of claim 5, wherein the first one of the sacrificial layers has a germanium atomic concentration in a range from about 40 to 100 atomic percent, and the second one of the sacrificial layers has a germanium atomic concentration in a range from about 5 to 40 atomic percent.

7. The method of claim 5, wherein the germanium atomic concentration of the first one of the sacrificial layers decreases as a distance from the substrate increases.

8. The method of claim 4, wherein a first one of the sacrificial layers in a lower position has a thicker thickness than a second one of the sacrificial layers in a higher position.

9. The method of claim 1, wherein the second etching process has an etching rate increasing in a direction from an upper portion to a lower portion of the fin structure.

10. The method of claim 1, wherein the first pressure is in a range from about 3 to less than 8 Torr.

11. A method, comprising:
alternately depositing first and second semiconductor layers on a substrate, a first one of the first semiconductor layers in a lower position having a higher germanium atomic concentration than a second one of the first semiconductor layers in a higher position;

performing a first etching process on the first and second semiconductor layers to form a fin structure on the substrate under a first pressure, the fin structure having alternating first and second nanostructures, the first nanostructures comprising remaining portions of the first semiconductor layers, and the second nanostructures comprising remaining portions of the second semiconductor layers;

performing, using a bromine-containing gas, a second etching process on the fin structure under a second pressure higher than the first pressure, wherein the second pressure is in a range from about 8 to 12 Torr;

forming epitaxial structures on either side of the fin structure;

removing the first nanostructures of the fin structure such that the second nanostructures of the fin structure are suspended over the substrate; and forming a gate structure to surround each of the suspended second nanostructures.

12. The method of claim 11, wherein the first and second etching processes both are reactive ion etch processes.

13. The method of claim 12, wherein the first one of the first semiconductor layers has a germanium atomic concentration in a range from about 40 to 100 atomic percent, and the second one of the first semiconductor layers has a germanium atomic concentration in a range from about 5 to 40 atomic percent.

14. The method of claim 11, wherein the bromine-containing gas comprises HBr gas.

15. The method of claim 11, wherein the first etching process is performing by using an etching gas without the bromine-containing gas.

16. The method of claim 11, wherein after performing the second etching process, a lower portion of the fin structure has a smaller lateral dimension than an upper portion of the fin structure.

17. A method, comprising:

forming a plurality of channel layers over a substrate, wherein the channel layers extends in a first direction, and the channel layers are arranged in a second direction substantially perpendicular to a top surface of the substrate;

forming source/drain regions over the substrate, the channel layers being disposed between the source/drain regions, wherein when viewed in a cross section taken along a third direction perpendicular to the first direction, a first one of the channel layers has a lateral dimension smaller than a lateral dimension of a second one of the channel layers; and forming a gate structure extending along the third direction and surrounding each of the first and second ones of the channel layers.

18. The method of claim 17, wherein the first one of the channel layers has a smaller thickness than the second one of the channel layers.

19. The method of claim 17, wherein the first one of the channel layers is in a position lower than the second one of the channel layers.

20. The method of claim 17, wherein the channel layers each have a slant side surface.

* * * * *